(12) United States Patent
Ehrmann et al.

(10) Patent No.: US 8,269,137 B2
(45) Date of Patent: Sep. 18, 2012

(54) LINK PROCESSING WITH HIGH SPEED BEAM DEFLECTION

(75) Inventors: Jonathan S. Ehrmann, Sudbury, MA (US); Joseph J. Griffiths, Winthrop, MA (US); James J. Cordingley, Littleton, MA (US); Donald J. Svetkoff, Ann Arbor, MI (US); Shepard D. Johnson, Andover, MA (US); Michael Plotkin, Newton, MA (US)

(73) Assignee: GSI Group Corporation, Bedford, MA (US)

( * ) Notice: Subject to any disclaimer, the term of this patent is extended or adjusted under 35 U.S.C. 154(b) by 1003 days.

(21) Appl. No.: 12/233,476

(22) Filed: Sep. 18, 2008

(65) Prior Publication Data

US 2009/0095722 A1 Apr. 16, 2009

Related U.S. Application Data

(60) Provisional application No. 60/994,404, filed on Sep. 19, 2007.

(51) Int. Cl.
*B23K 26/36* (2006.01)
(52) U.S. Cl. ............... 219/121.69; 438/132; 29/847
(58) Field of Classification Search ........... 219/121.67–121.72, 121.78, 121.82, 219/121.85; 438/132; 29/847
See application file for complete search history.

(56) References Cited

U.S. PATENT DOCUMENTS

| | | | |
|---|---|---|---|
| 4,432,613 A | 2/1984 | Ueda et al. | |
| 4,602,852 A | 7/1986 | Moroz | |
| 5,262,887 A | 11/1993 | Feinberg | |
| 5,300,756 A | 4/1994 | Cordingley | |
| 5,636,172 A | 6/1997 | Prall et al. | |
| 5,653,900 A | 8/1997 | Clement et al. | |
| 5,998,759 A * | 12/1999 | Smart | 219/121.69 |
| 6,144,118 A | 11/2000 | Cahill et al. | |
| 6,172,896 B1 | 1/2001 | Lee | |
| 6,181,728 B1 | 1/2001 | Cordingley et al. | |
| 6,281,471 B1 | 8/2001 | Smart | |
| 6,300,590 B1 | 10/2001 | Lauer et al. | |
| 6,302,729 B2 | 10/2001 | Möckel et al. | |
| 6,339,604 B1 | 1/2002 | Smart | |
| 6,340,806 B1 | 1/2002 | Smart et al. | |
| 6,483,071 B1 | 11/2002 | Hunter et al. | |
| 6,486,526 B1 | 11/2002 | Narayan et al. | |
| 6,495,791 B2 * | 12/2002 | Hunter et al. | 219/121.6 |
| 6,639,177 B2 | 10/2003 | Ehrmann et al. | |
| 6,803,612 B2 | 10/2004 | Lehr et al. | |

(Continued)

OTHER PUBLICATIONS

International Preliminary Report on Patentability dated Apr. 29, 2010.

(Continued)

*Primary Examiner* — Samuel M Heinrich
(74) *Attorney, Agent, or Firm* — Knobbe, Martens, Olson & Bear LLP

(57) ABSTRACT

The present invention relates to the field of laser processing methods and systems, and specifically, to laser processing methods and systems for laser processing multi-material devices. Systems and methods may utilize high speed deflectors to improve processing energy window and/or improve processing speed. In some embodiments, a deflector is used for non-orthogonal scanning of beam spots. In some embodiment, a deflector is used to implement non-synchronous processing of target structures.

11 Claims, 16 Drawing Sheets

U.S. PATENT DOCUMENTS

| | | | |
|---|---|---|---|
| 6,816,294 B2 | 11/2004 | Unrath et al. | |
| 6,900,516 B1 | 5/2005 | Bänisch et al. | |
| 7,019,891 B2 | 3/2006 | Johnson | |
| 7,050,208 B2 | 5/2006 | Overbeck | |
| 7,057,217 B2 | 6/2006 | Kang et al. | |
| 7,126,746 B2 * | 10/2006 | Sun et al. | 359/333 |
| 2002/0167581 A1 | 11/2002 | Cordingley et al. | |
| 2005/0279739 A1 | 12/2005 | Bruland et al. | |
| 2007/0119831 A1 | 5/2007 | Kandt | |
| 2008/0299783 A1 | 12/2008 | Bruland et al. | |

OTHER PUBLICATIONS

Crystal Technology, Inc., DDS AODS 20160 Direct Digital Synthesizers Product Brief, Jan. 2006.

Smart et al., Chapter 19 Link Cutting/Making, LIA Handbook of Laser Materials Processing, May 2001, pp. 595-615, Laser Institute of America, ISBN: 0-912035-15-3.

International Search Report and Written Opinion dated Mar. 26, 2010.

\* cited by examiner

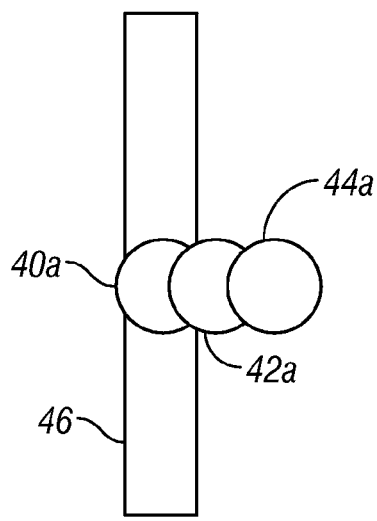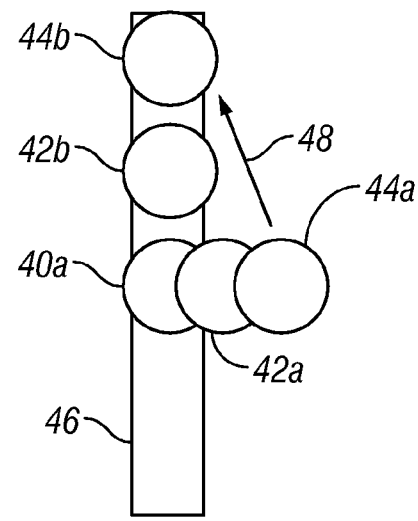
FIG. 10A
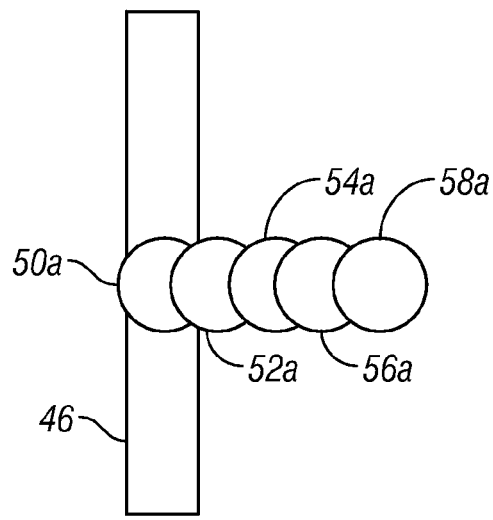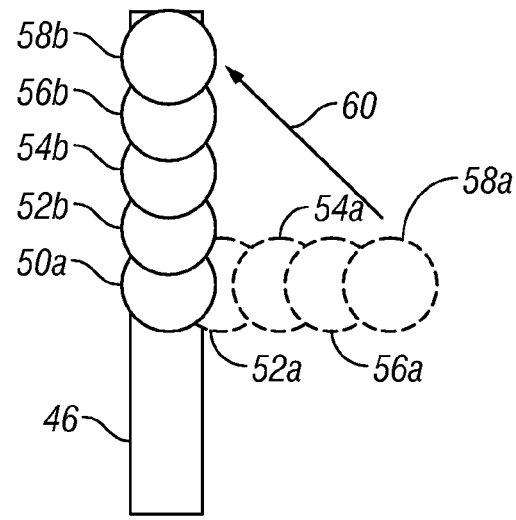
FIG. 10B

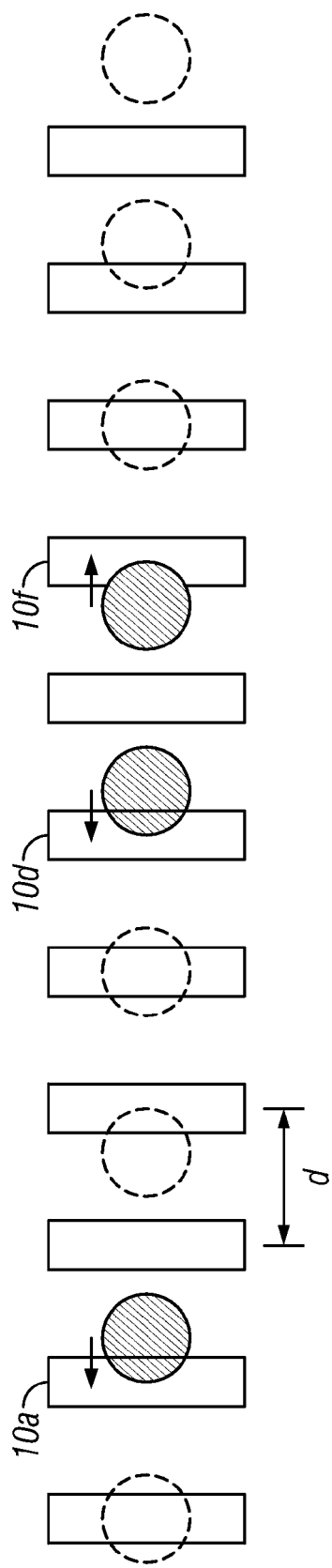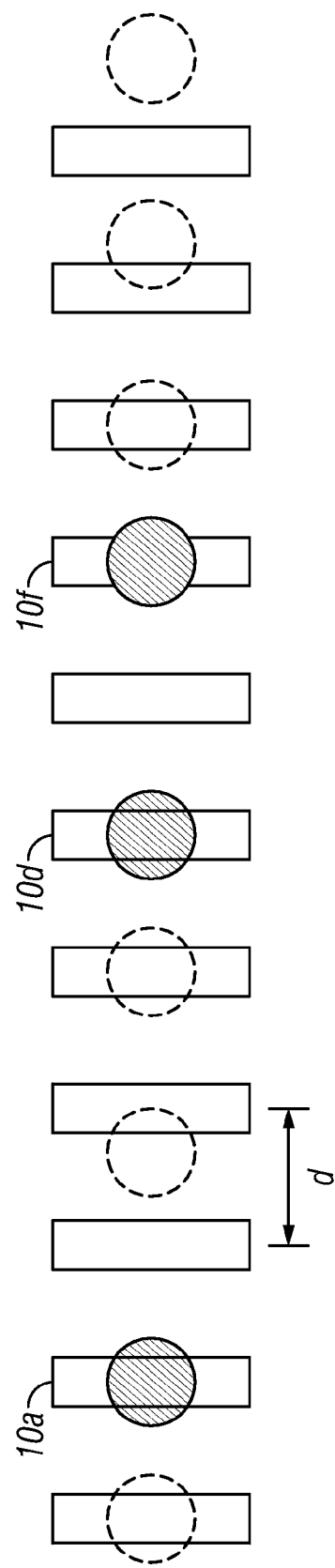
*FIG. 20*      *FIG. 21*

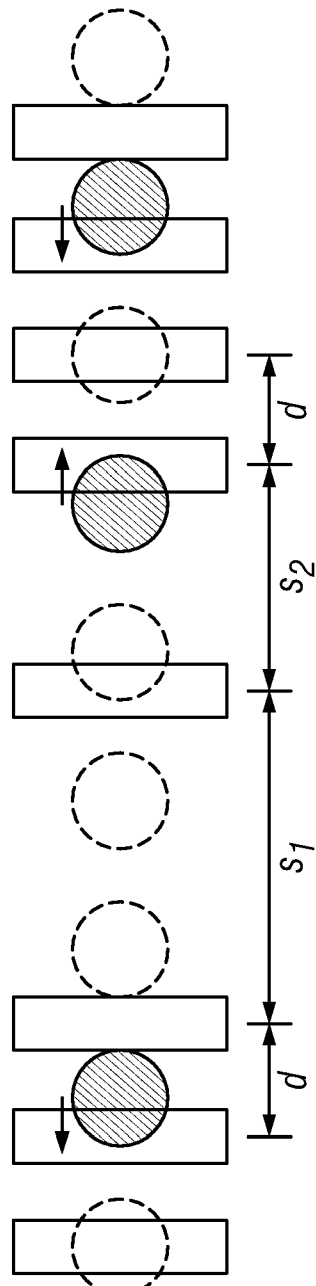
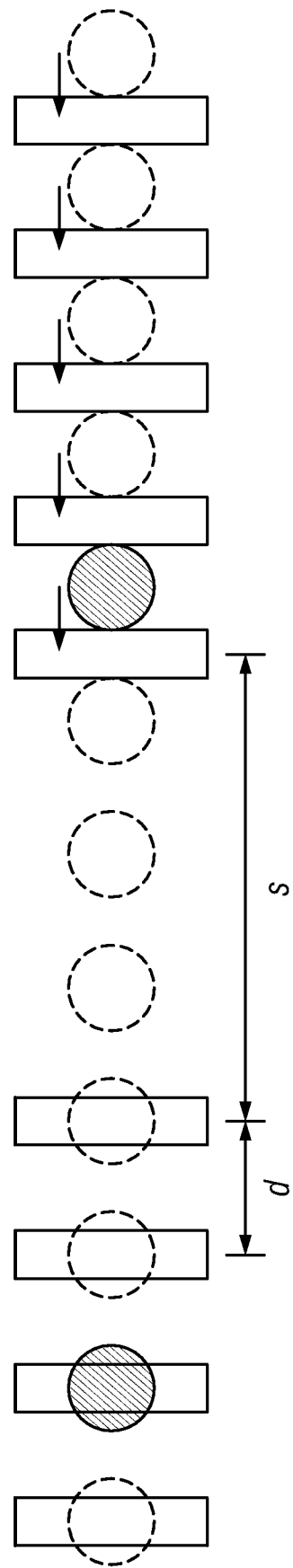
FIG. 22A
FIG. 22B

LINK PROCESSING WITH HIGH SPEED BEAM DEFLECTION

CROSS REFERENCE TO RELATED APPLICATIONS

This application claims priority under 35 U.S.C. Section 119(e) to Provisional Application No. 60/994,404, filed on Sep. 19, 2007, which application is incorporated by reference in its entirety.

BACKGROUND OF THE INVENTION

1. Field of the Invention

The present invention relates to the field of laser processing methods and systems, and specifically, to laser processing methods and systems for laser processing multi-material devices.

2. Description of the Related Art

Lasers can be used in the processing of microstructures in memory and integrated circuit devices. For example, laser pulses can be used to ablate conductive links or link portions in a memory device, such as DRAMs in order to substitute working redundant memory cells for defective memory cells during memory manufacture.

Recently, the use of new materials, such as aluminum, gold, and copper, coupled with the small geometry of these devices, have made the problem of link removal more difficult. Economics and device performance goals have driven the size for the DRAMs and logic devices to very small physical dimensions. Thus, it can be increasingly difficult to irradiate a target structure without damaging surrounding components such as the substrate and adjacent circuitry and links. Furthermore, as more links need to be processed for a given area of semiconductor circuitry, the time required to process a given die increases.

When a single laser pulse or burst of pulses is used to irradiate and sever each link designated for removal, the beam path of laser pulses may move relative to the substrate during the process of irradiation in an "on-the-fly" link blowing process. This relative movement may include moving the substrate and/or moving the beam, although substrate motion on an X-Y stage in conjunction with a vertically oriented and stationary beam is a currently common approach. In conventional laser processing systems, groups of arrayed microstructures are processed. The array may be links in a row, links in closely spaced rows, links in staggered rows and similar regularly spaced arrangements. The conventional processing is generally carried out with either an energy on demand system (e.g. pulse equalization) or an energy picking system (e.g. pulse picking). In the energy on demand system, an irradiation period is timed to coincide with a moving target and the processing rate is limited by a minimum period between energy on demand irradiation periods. In the energy picking system, the laser is pulsed in a continuously repeating sequence at a predetermined repetition rate (e.g. at a q-rate, pulse rate, or burst rate) and the arrayed microstructures in a group are moved synchronously with the repetition rate so that energy is available to process any microstructure in a particular group. The processing rate is limited by a period associated with the maximum repetition rate, and an acousto-optic device or other optical switching device blocks energy from reaching the substrate except when processing a selected synchronized target.

The conventional energy picking process is illustrated in FIGS. 1 and 2. A repeating sequence of laser pulses, for example pulses from a q-switched laser, pulses from a sequence of pulse bursts, or a sequence of temporally shaped pulses is generated at a predetermined repetition rate. A group of links 10 having a characteristic spacing d is put in motion relative to a processing head at a predetermined velocity V by moving a stage 12 under control of a control computer 14. As adjacent links move relative to the processing head, there is an associated transit time T1 such that after a period equal to T1, the substrate has moved by an amount equal to the characteristic spacing of the links. Put another way, the link to link period at velocity V relative to the processing head is T1.

In a conventional processing system links and pulses are synchronized. T1 and the period of the laser pulse repetition rate (e.g. the pulse to pulse period of a q-switched laser controlled by trigger signals from the control computer 14) are made equal. With this method, a pulse is available to process every link. Pulses that are synchronized with links to be processed, such as links 10a, 10d, and 10f FIG. 2, are allowed to reach the targets and process the respective links. Pulses that are synchronized with links that are to remain intact are blocked from reaching the targets by an energy control and pulse picking system 16 of FIG. 1, as indicated by dashed circles in FIG. 2 where the beam would strike if it was not blocked.

It will be appreciated that the time required to process a given set of links within a group of a row or a column of links is approximately the number of links times the time period T1, which in these systems equals the laser pulse repetition rate. If the laser used has a maximum pulse rate of 50 kHz, for example, completing the pass of the beam across the 11 links of FIG. 1 will require at least 200 microseconds.

Although the above embodiment was described in terms of single pulse link processing, link blowing systems have been described that apply multiple pulses to each link to sever the link. FIG. 3 shows a system which applies a burst or sequence of two pulses to each link. In this embodiment, the pulse selector 16 selects groups of pulses rather than individual pulses for link processing. In some embodiments, the laser itself produces separated bursts of pulses where the pulse to pulse separation within the burst is much less than the separation between bursts. In these embodiments, the pulse picker 16 selectively passes or blocks pulse bursts. Other known embodiments use multiple lasers or split and re-combined pulses to produce a variety of intensity profiles of the laser energy applied to a link for processing. It will therefore be appreciated that all of the discussion throughout this document related to applying a pulse to a target structure for processing includes applying a sequence of pulses, pulse groups, combined pulses, or pulse bursts, or any other irradiance intensity profile for performing a complete or partial target processing function.

In many advantageous embodiments, the pulse picker 16 is an acousto-optic modulation device, but may be an electro-optic switch, a fast steering mirror or any other type of optical switch with sufficient speed and accuracy.

Other uses in addition to pulse picking for acousto-optic modulators, fast steering mirrors, or other forms of high speed deflectors have also been described. One such use is for beam position correction along the direction of beam motion if a long pulse or pulse burst is being applied to process a link. Without correction, if the pulse or pulse burst is short relative to the transit time of the beam spot across the link during the pulse or pulse burst duration, the beam spot will not move appreciably during the above described relative beam and link motion during the on-the-fly processing. However, as shown in FIG. 4, if the burst has many pulses or includes relatively long inter-pulse spacing, the beam spot can walk off the center of the link 18 over the course of the pulse sequence.

In U.S. Patent Publication 2002/0167581 to Cordingley et al., a deflector (e.g., a high-speed deflector) is described to deflect laser pulses to improve the coincidence of the pulses with the target structures in this situation. As described in this Publication, the deflector can act to oppose the relative movement of the beam spot across the link. In one embodiment generally illustrated in FIG. 5, the deflector 20 would be operatively coupled to the relative positioning system. The deflector 20 is preferably solid state and may be a single axis acousto-optic device which has a very fast "retrace"/access time. Alternatively, a higher speed electro-optic deflector (e.g., a gradient index reflector or possibly a digital light deflector) may be used. The time-bandwidth product (number of spots) can be traded for response time on an application basis. Alternatively, an electro-optic modulator may be used with a separate acousto-optic deflector operated in a "chirp mode" (e.g., linear sweep as opposed to random access mode) and synchronized (triggered) based on the positioning system coordinates. A modulator 22 may be used for intensity control and pulse gating/selection, to select pulses 24 at times $t_1, t_2, t_3$ for target structure processing. As the beam path moves further across and beyond an edge of a target structure during a sweep of a multiple pulse processing function, the deflector 20 would more strongly deflect the beam path in a direction opposing the relative movement. Thus, a plurality of pulses would irradiate approximately the same portion of the target structure. U.S. Publication Number 2002/0167581 is hereby incorporated by reference in its entirety.

Another application of an acousto-optic modulator in a beam path of a laser processing machine is also described in U.S. Publication Number 2002/0167581. In an embodiment described therein with reference to FIG. 20, an acousto-optic modulator is used as a beam splitter to allow the processing of more than one target structure at a time. The beam paths of the resulting beams may be controlled by controlling the frequencies applied to the acousto-optic modulator to simultaneously position each resulting beam accurately on the targets to be processed.

Although high speed beam scanning within a dominant fundamental beam trajectory has been utilized in a variety of contexts such as described above, additional uses of high speed deflectors in link blowing systems would be useful in the field.

For further reference, the following co-pending U.S. applications and issued patents are assigned to the assignee of the present invention, describe many additional aspects of laser link blowing, and are hereby incorporated by reference in their entirety:

1. U.S. Pat. No. 5,300,756, entitled "Method and System for Severing Integrated-Circuit Connection Paths by a Phase Plate Adjusted Laser beam";
2. U.S. Pat. No. 6,144,118, entitled "High Speed Precision Positioning Apparatus";
3. U.S. Pat. No. 6,181,728, entitled "Controlling Laser Polarization";
4. U.S. Pat. No. 5,998,759, entitled "Laser Processing";
5. U.S. Pat. No. 6,281,471, entitled "Energy Efficient, Laser-Based Method and System for Processing Target Material";
6. U.S. Pat. No. 6,340,806, entitled "Energy-Efficient Method and System for Processing Target Material Using an Amplified, Wavelength-Shifted Pulse Train";
7. U.S. Pat. No. 6,483,071, entitled "Method and System For Precisely Positioning A Waist of A Material-Processing Laser Beam To Process Microstructures Within A Laser-Processing Site", filed 16 May 2000, and published as WO 0187534 A2, December, 2001;
8. U.S. Pat. No. 6,300,590, entitled "Laser Processing"; and
9. U.S. Pat. No. 6,339,604, entitled "Pulse Control in Laser Systems."
10. U.S. Pat. No. 6,639,177, entitled "Method and System For Processing One or More Microstructures of A Multi-Material Device"

The subject matter of the above referenced applications and patents is related to the present invention. References to the above patents and applications are cited by reference number in the following sections.

SUMMARY OF THE INVENTION

In one embodiment, the invention comprises a method for laser processing a multi-material device including a substrate and at least one target structure. The method comprises producing relative motion in a first direction between a beam path and a substrate having at least one target structure thereon, generating a first pulse and irradiating a first portion of the target structure with the first pulse wherein a first beam waist associated with the first pulse and the at least one microstructure substantially coincide. A second pulse is generated, the second pulse being delayed a predetermined time relative to the first pulse. The second pulse is deflected in a second direction, wherein the second direction is non-parallel to the first direction, and a second portion of the at least one microstructure is irradiated with the deflected second pulse wherein a second beam waist associated with the deflected second pulse and the second portion of the at least one microstructure substantially coincide.

In another embodiment, such a method comprises producing relative motion in a first direction between a beam path and a substrate having at least one target structure thereon, generating a first pulse and irradiating a first portion of the target structure with the first pulse wherein a first beam waist associated with the first pulse and the at least one microstructure substantially coincide. A second pulse is generated, the second pulse being delayed a predetermined time relative to the first pulse. In this embodiment, the second pulse is deflected so as to irradiate the at least one target structure with the deflected second pulse, wherein a second beam waist associated with the deflected second pulse and a longitudinally distinct second portion of the at least one target structure substantially coincide.

In another embodiment, a method for laser processing a multi-material device including a substrate and a target structure comprises scanning a plurality of applied laser pulses in a direction substantially parallel to the length of the target structure as the substrate moves in a direction that is non-parallel to the length of the target structure.

Another method of processing a multi-material device including a substrate and at least one microstructure comprises producing relative motion between a beam path and a substrate having at least one target structure thereon, generating a first pulse, deflecting the first pulse in a first direction, and irradiating the at least one microstructure with the first deflected pulse wherein a first beam waist associated with the first deflected pulse and the at least one microstructure substantially coincide. A second pulse is generated, the second pulse being delayed a predetermined time relative to the first pulse. The second pulse is deflected in a second direction, wherein the second direction is non-parallel to the first direction. The at least one microstructure is irradiated with the deflected second pulse wherein a second beam waist associated with the deflected second pulse and the at least one microstructure substantially coincide.

In another embodiment, a method for laser processing a multi-material device including a substrate and at least one target structure comprises producing relative motion at a pre-determined average velocity V between a beam delivery subsystem and a substrate having a plurality of adjacent microstructures thereon, the plurality including the at least one target structure, and generating a pulsed laser output comprising a sequence of pulses, pulse groups, combined pulses, or pulse bursts, wherein the sequence is characterized by a minimum synchronization period T. The plurality of microstructures are separated by a spatial distance S in the direction of relative motion and $t_1$ is the transit time S/V between at least one pair of adjacent microstructures. In this embodiment, $t_1$ is not equal to the predetermined period T.

Another embodiment of a method for laser processing a multi-material device including a substrate and at least one target structure comprises grouping microstructures into sets of N structures and producing P laser pulses, combined pulses, pulse groups or pulse bursts for each set of N microstructures in a pass of a laser beam waist position over the sets of target structures. In this embodiment, P is not equal to N. The method further comprises processing at least one target structure during the pass.

In yet another embodiment, a method for laser processing a multi-material device including a substrate and at least one target structure comprises receiving data corresponding to coordinates of target microstructures to be processed, determining a processing trajectory segment including a plurality of target microstructures along a row or column of microstructures. A pulsed laser output is generated comprising a sequence of pulses, pulse groups, combined pulses, or pulse bursts, wherein the sequence is at least partially unsynchronized with respect to the trajectory. The method further comprises determining a relative displacement between each target microstructure and a corresponding laser pulse in the sequence, generating a deflection command sequence corresponding to the relative displacements, deflecting the pulsed laser output according to the deflection command sequence during relative motion between the substrate and a beam positioning subsystem to synchronize the target microstructures and the corresponding laser pulses, and irradiating each target microstructure with at least a portion of the pulsed laser output.

BRIEF DESCRIPTION OF THE DRAWINGS

FIGS. 10A and 10B show spot motion on links in another embodiment.

FIG. 20 shows non-synchronous beam spot positions prior to correction.

FIG. 21 shows non-synchronous beam spot positions following correction.

FIG. 22A shows non-synchronous pulses applied to a mixed pitch link row.

FIG. 22B shows non-synchronous pulses applied to a mixed phase link row.

DETAILED DESCRIPTION OF THE PREFERRED EMBODIMENT

Figure 1:
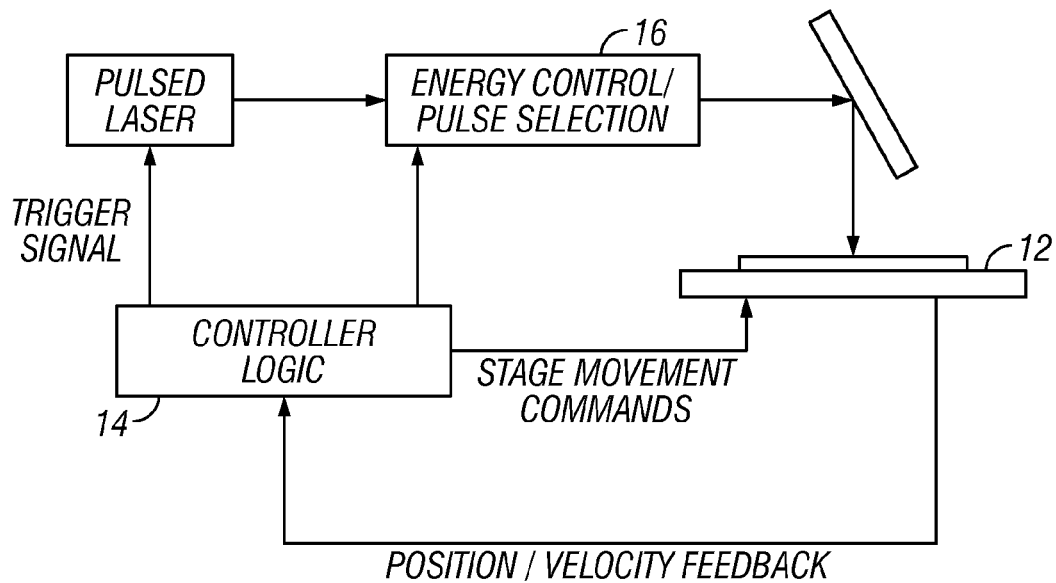
FIG. 1 is a block diagram illustrating several conventional components of a laser processing system.

Methods and systems described herein relate to laser processing target structures of multi-material devices utilize multiple laser pulses. While this invention is well suited for improvements in processing closely spaced metal and non-metal links on semiconductor substrates, other types of multi-material devices may be laser processed with various benefits including, but not limited to increased process throughput, increased accuracy, reduced substrate damage, and reduced damage to adjacent devices.

General Aspects of Laser Processing of Target Microstructures

Many aspects of processing links on a multi-material device that may be used advantageously with this invention are described in sections [0115] to [0159], [0169] to [0175], and [0213] to [0225] of U.S. Patent Publication 2002/0167581, which is mentioned above.

A multi-material device may include a plurality of target structures positioned over a substrate. A pulsed laser beam, the beam having pre-determined characteristics for processing of microscopic structures, is used to cleanly remove at least a portion of a target structure. An application of the method and system of the present invention is severing of conductive links which are part of a high speed semiconductor memory device. The targets may have a sub-micron dimension, including a dimension below the wavelength of the laser beam. The target may be separated from a semiconductor substrate by a multi-layer stack, which may have several dielectric layers. Furthermore, both the temporal and spatial characteristics of the pulse may be selected or controlled based on the thermal and optical properties of the microscopic target, underlying layer materials, and the three-dimensional layout of the device structure, including the spacing of target structures and functional inner conductor layers.

In many embodiments of the present invention, one or more laser pulses irradiate a generally rectangular target structure or microstructure. In one embodiment, an output from a laser system is generated to produce a sequence of pulses, pulse groups, combined pulses, or pulse bursts. In some embodiments, each pulse has a rise time fast enough to efficiently couple energy into a highly reflective target structure. The total duration of irradiation is sufficient to process at least a portion of the target structure wherein at least a portion of the structure is cleanly removed without leaving operationally significant amounts of residue, slag, or other debris. The fall time is preferably fast enough to avoid creating undesirable damage to the layers or substrate.

The temporal pulse shape may be selected, in part, based on physical properties of the target microstructure, for instance, thickness, optical absorption, thermal conductivity, or a combination thereof. In some embodiments of the invention, the processing will occur with a single pulse having a fast leading edge relative to a selected pulse duration of several nanoseconds. In some embodiments, the laser output used to process a target structure may be a series of narrow q-switched Gaussian shape or rectangular pulses, with very fast rise time, for example 800 ps pulses representative of the output of commercially available q-switch micro-lasers. The pulses may be delayed with respect to each other so as to provide a burst of pulses to irradiate the target structure. The laser output may be generated with a combination of a high bandwidth seed laser diode and fiber optic amplifier with Raman shifting, or with a waveguide amplifier system. Alternatively, a desirable pulse characteristic may be provided with various modified q-switched systems or with the use of high speed electro-optic modulators. Other pulse shapes may be selected for the material processing requirements. For instance, a sequence of closely spaced pulses having duration from a few picoseconds to several nanoseconds is taught in Reference 5.

Figure 5:
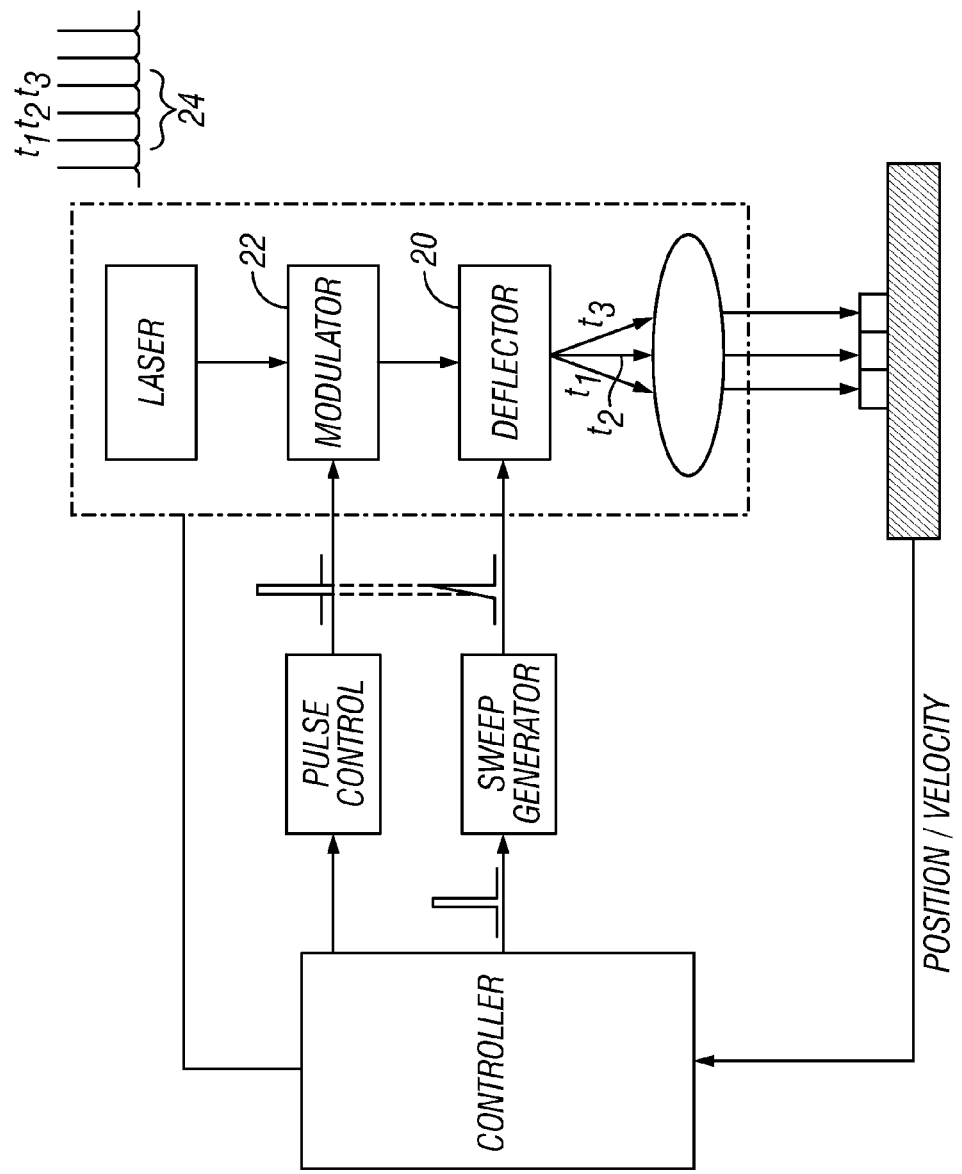
FIG. 5 is a block diagram of a laser processing system configured to correct for relative motion during link processing.

In one embodiment, a high bandwidth MOPA configuration is used to amplify the laser output of a high speed semiconductor diode. Generation of various pulse shapes and duration with direct modulation of the diode is considered advantageous, provided any affect associated with variable amplitude drive waveforms does not affect overall performance. Further details of various aspects of pulse generation and amplification can be found in references 5 and 6 (e.g., in '471—Reference 5—FIG. 5 and columns 14-16).

As indicated above, embodiments of the laser system may include fiber optic amplifiers which amplify the preferred square pulse shape generated by a seed laser. The seed laser may be a high speed semiconductor diode or the shaped output of a modified q-switched system. The amplified output may be matched in wavelength to the input or Raman-shifted as taught in References 4 and 6 (e.g., in Reference 6, FIGS. 12-13 and column 14, line 57—column 19, line 3). Wavelength shifting of a short pulse q-switched laser output is generally taught in '759 Reference 4.

In an alternative arrangement the seed laser is a semiconductor diode and the optical amplifier is a waveguide amplifier. Advantages of an embodiment with a waveguide amplifier when compared to a fiber system include avoidance of Raman shifting, lower pulse distortion at the speed of operation, and, with proper design, minimal thermal lensing. A precision anamorphic optic system is used to optimize coupling between the seed and amplifier. Basic description of waveguide amplitude and lasers can be found in product literature provided by Maxios, Inc. and in the article "CW and passively Q-switched Cladding Pumped Planar Waveguide Lasers," Beach et. al. Yet another amplifier system including a 28 DB planar waveguide amplifier for use at 1.064 micron wavelengths was developed by University of Southhampton and described in "A Diode Pumped, High Gain, Planar Waveguide, Nd:Y3Al5O12 Amplifier."

In an alternative arrangement, for generation of a fast rising pulse or other desirable shape, a plurality of q-switched micro-lasers can be used. The modules produce a q-switched waveform with pulse durations of about 1 nanosecond or less, for example 800 ps to 2 ns for commercially available units. An example of a commercially available laser is the AOT-YVO-1Q available from Advanced Optical Technology (AOTLasers.com). These recently developed short pulse, active q-switch lasers can be triggered with a TTL pulse at a variable repetition rate while maintaining specified sub-nanosecond timing jitter. In general, the pulse shape incident on the target microstructure will vary significantly at repetition rates approaching the maximum rate. Reference 9 teaches methods of maintaining a constant pulse shape despite variations in the temporal spacing of pulses incident on a target (e.g., see the figures and associated specification). AOT offers a pulsewidth of 2 nanoseconds available at a repetition rate of 20 KHz. Frequency doubled versions are also available (532 nm). IMRA America reports 800 ps pulses with the PicoLite system, and high peak power was obtained with fiber amplification at repetition rates up to 10 KHz. Shorter pulsewidths, for instance about 1 ns or less, are available at slower repetition rates. Laser processing with pulses in the 1-100 picosecond range has been described and performed with more recently developed laser systems.

As known in the art and illustrated in Reference 5 (e.g., FIGS. 1C, 2), the q-switched waveforms may approximate (at least to 1st order) a symmetric Gaussian shape, or a fast rising pulse with an exponential tail, depending on the stored energy. With reference to Publication 2002/0167581, a series of devices, with appropriate delays introduced by a plurality of triggering signals, or delays of a trigger signal with a delay line, may be used to generate a series of spaced apart pulses. The optical outputs are preferably combined with appropriate bulk optics (polarization sensitive), fiber optics, or waveguides to form a single output beam. The resultant addition of the q-switched waveforms produces a fast rise time characteristic and relatively short duration. An optical amplifier may be used to increase the output power as needed. Shaped pulses may be produced, for example, by using a beam combiner to deliver the output of two lasers (or the output of a single laser split by a beam splitter) to an amplifier or using a modulator approach to chop the leading edge or tail of the pulse but with a two-stage or shaped modulation voltage pulse.

During system operation for memory repair, position information, obtained with a precision measurement system, is used to relatively position the focused beam waist of the pulsed laser at a location in space to substantially coincide with the three-dimensional coordinates (Xlink,Ylink,Zlink) of the target. A trigger pulse, generated to produce a laser pulse at a time where the laser beam waist and target width position substantially coincide, operates in conjunction with the laser and associated control circuitry in the laser subsystem to produce an output pulse.

References 2 and 7 describe details of a method and system for precision positioning, including three-dimensional beam waist positioning. Reference 7 describes an embodiment for producing an approximate diffraction limited spot size with a range of spot size adjustment (e.g., FIGS. 7-9 of WO0187534

('534) and the associated specification), and a method and system for three-dimensional positioning of the beam waist. Three-dimensional (height) information is obtained, for instance with focus detection, and used to estimate a surface and generate a trajectory (e.g., FIGS. 2-5 of '534 and the associated specification). The laser is pulsed at a location substantially corresponding to the three-dimensional position of the link (Xlink, Ylink, Zlink) (e.g., FIGS. 10a-b of '534 and the associated specification).

In practice, the three-dimensional measurement and positioning are used to compensate for topographical variations over a wafer surface, or other position variations introduced in a system (mis-alignment). These variations are generally system or application dependent and may exceed several microns, which in turn may exceed the depth of focus of the focused laser beam. In some micro-machining applications the system positioning requirements may be relaxed if certain tolerances are maintained, or if external hardware manipulates the device position, as might be done with a micro-positioning sub-system. The device may comprise a miniature part (e.g., single die) which is positioned by an external micro-positioning subsystem to a predetermined reference location. Similarly, if a miniature part has a pre-determined tolerance the positioning may be based on single measurement at a reference location or perhaps a single depth measurement combined with a lateral (X,Y) measurement. For processing of multilevel devices on wafers, (e.g.: 300 mm) at high speed it is expected that densely sampled three-dimensional information will improve performance, particularly as link dimensions shrink.

In applications requiring very high speed operation over a large surface (e.g., 300 mm wafer), an alternative method is to combine information which may be predetermined (e.g., the plane of a wafer chuck relative to a beam positioner plane of motion measured during a calibration process) with dimensional information obtained from each part to be processed. For example, in '534, FIGS. 1-2, a fraction of the tilt of region 28 may be associated with fixturing). For example, the steps may include (a) obtaining information identifying microstructures designated for removal, (b) measuring a first set of reference locations to obtain three-dimensional reference data, (c) generating a trajectory based on at least the three-dimensional reference data to obtain a prediction of beam waist and microstructure surface locations, (d) updating the prediction during relative motion based on updated position information, the updated position information obtained from a position sensor (e.g., encoder) and/or from data acquired during the relative motion. The additional data may be measurement data acquired at additional alignment target or at other locations suitable for an optical measurement (e.g., dynamic focus). Reference 2 describes a system wherein a precision wafer stage is used to position a wafer at high speed. A method of obtaining feedback information with resolution of a fraction of one nanometer is disclosed wherein interferometric encoders are used, and such a high precision method is preferred. In Reference 2 it was noted that other conventional laser interferometers may also be used. FIGS. 9-11 and columns 5-6 of Reference 2 describe aspects of the precision measurement subsystem associated with the precision positioning apparatus. Additionally, designated reference locations on the workpiece (e.g., wafer) which may be an x,y alignment target or a region suited for a three-dimensional measurement may be used for various applications. It should also be noted that height accuracy of about 0.1 µm was reported in "In-situ height correction for laser scanning of semiconductor wafers," Nikoonhad et al., Optical Engineering, Vol. 34, No. 10, October 1995, wherein an optical position sensor obtained area averaged height data at high speeds. Similarly, a dynamic focus sensor (e.g., astigmatic systems used for optical disk tracking and control) may be used to obtain height information provided the data rate is fast enough to support "on the fly" measurement.

Various combinations of the above technologies can be used depending upon the application requirements. A combination may be based on the number and typical distribution over a device of microstructures designated for removal. When a large number of repair sites are distributed across a device, the throughput may be maximized by providing updates "on the fly."

In an application of the invention, the target structure is provided as a part of a multi-material, multi-layer structure (e.g., redundant memory device). The multi-layer stack having dielectric layers provides spacing between the link and an underlying substrate. In one type of multi-layer memory device, alternating layers of Silicon Dioxide and Silicon Nitride may be disposed between a link target structure and a Silicon substrate. The target structure is generally located in proximity to other similar structures to form a 1-D or 2-D array of fuses which are designated for removal. In addition to the link structure, underlying conductors disposed as part of the functional device circuitry, may be in proximity to the link structure, and arranged in a series of patterns covered by relatively thin (<0.1 µm typical) Silicon Nitride and thicker (1 µm typical) Silicon Dioxide materials.

The irradiance distribution at the link may substantially conform to a diffraction limited, circular Gaussian profile. In another useful embodiment, the beam has an approximate elliptical Gaussian irradiance profile, as might be produced with an anamorphic optical system, or with a non-circular laser output beam. In one embodiment, the incident beam has a non-uniform aspect ratio. Alternatively, rectangular or another chosen spatial profiles may be implemented in a lateral dimension. For example, Reference 10 discloses various advantageous methods and optical systems for spatially shaping of laser beams for application to memory repair and Reference 1 discloses various advantageous methods and optical systems for "non-Gaussian" irradiance distribution of laser beams for application to memory repair.

With the nearly diffraction limited elliptical Gaussian case, the preferable minimum beam waist dimension at location approximates the narrow target width dimension of FIG. 1B, which, in turn, produces high pulse energy density at the link. Further, with this approach, a high fraction of the laser energy is coupled to the link and background irradiance is reduced.

A typical link used in a present memory has width and thickness of about 1 µm or less, for example, 0.6 µm, and length of about five microns. Future memory requirements are expected to further reduce the scale of target dimensions. The minimum beam waist dimension $W_{yo}$ at will typically overfill the sub-micron link to some degree, whereas aspect ratio $W_{xo}/W_{yo}$ with $W_{xo}$ a few microns along the link, can facilitate clean link removal. Additionally, rapidly decreasing energy density on the layers and substrate may be achieved through defocus of the high numerical aperture beam portion.

Pulse energies in the range of about 0.1 to 3 µj have been found effective, with a preferred typical range of about 0.1-5 µj considered sufficient margin for spot shape and process variations. The preferred pulse duration may be selected based upon the nominal link thickness specifications, or based on a model of the dissimilar thermal and optical properties of adjacent materials. Lower energies per pulse may be utilized when the target is processed with bursts of multiple pulses.

Hence, a combination of the spatial characteristics (e.g., beam waist shape and position) and the temporal (e.g., rise time, flatness, and duration) pulse characteristics avoids undesirable cracking of lower layers, avoids significant pulse interaction with inner layer conductor, and limits substrate heating.

Regarding laser wavelength, near IR (Infrared) wavelengths conveniently correspond to wavelengths where high bandwidth laser diodes are available, and to the spectral range where optical amplification of the pulsed laser beam can be efficiently produced with fiber and waveguide amplifiers. Those skilled in the art will recognize that amplified laser diode outputs, having a desired temporal pulse shape, may also be frequency multiplied to produce visible laser outputs when advantageous. The fast rise time of semiconductor diodes is particularly advantageous for producing a fast rise time, square pulse characteristic. Future developments in visible diode and optical amplifier technology may support direct pulse amplification in the visible range.

In some systems for link blowing, the link width is a fraction of one micron and the link spacing (pitch) is a few microns with present process technology. The link width may correspond to a wavelength of visible light. Further, at the microscopic scale of operation, where the lateral and/or thickness dimensions of the materials are on the order of the laser wavelength, the thickness and indices of refraction of the stack materials can significantly affect the overall optical characteristics of the stack.

In one embodiment of the invention, a preferred reduced wavelength is selected in the visible or near infrared range wherein a non-absorptive optical property of the layers (e.g., interference or reflection loss) is exploited.

U.S. Pat. No. 6,300,690 (Reference 8) describes a system and method for vaporizing a target structure on a substrate. The method includes providing a laser system configured to produce a laser output at the wavelength below an absorption edge of the substrate. Furthermore, Reference 4 discloses benefits of a wavelength less than 1.2 µm for processing links on memory devices wherein the substrate is Silicon, namely smaller spot size and shorter laser pulse widths. In accordance with the present invention, improved performance can be realized by exploiting the non-absorbing stack properties with wavelength selection. Furthermore, at least one of precision positioning of a high numerical aperture beam, spatial shaping of the spot, or temporal pulse shaping also will provide for reduced energy at the substrate. The result corresponds to a relatively low value of energy expected to be deposited in the substrate, despite an incident beam energy necessary to deposit unit energy in the target structure sufficient to vaporize the target structure.

The factors affecting the energy deposited in the substrate are, in effect, multiplicative. Likewise, at short visible wavelengths, copper is absorbing (e.g., about 50% at 500 nm, 70% in the near UV, compared to 2% at 1.064 µm) so less energy is required for clean removal, at least an order of magnitude. The preferred identified wavelength corresponding to a relatively low value of the energy expected to be deposited in the substrate is within a visible of near IR region of the spectrum. A model-based approach may be used to estimate the shortest wavelength with sufficient margin for a specified dielectric stack, spot position, tolerance, temporal and three-dimensional spatial pulse characteristics.

For processing on links on multilevel devices with Silicon substrates, the limiting wavelength corresponding to a relatively low value of the energy expected to be deposited in the substrate (e.g., below the image threshold) may be within the green or near UV region of spectrum, but the use may require tightly controlled system parameters, including possible control of the stack layer thickness or index of refraction.

With wavelength selection in accordance with the present invention, where the internal transmission and preferably reflection of the stack is at or near a maximum, stack layer damage is avoided. Furthermore, decreasing substrate irradiance, while simultaneously providing a reduced spot size for link removal (at or near diffraction limit), is preferred provided irradiation of functional internal layers is within acceptable limits. Spectral transmission curves for typical large bandgap dielectric materials generally show that the transmission decreases somewhat at UV wavelengths. For example, in HANDBOOK OF LASER SCIENCE AND TECHNOLOGY, the transmission range of Silicon Dioxide is specified as wavelengths greater than 0.15 µm. The absorption coefficient of both Silicon Nitride and Silicon Dioxide remains relatively low in the visible range (>400 nm) and gradually increases in the UV range.

In this context of laser based target processing, various embodiments of methods and apparatus for processing target structures will now be described.

Tilted Scan Processing and Alignment

Figure 6:
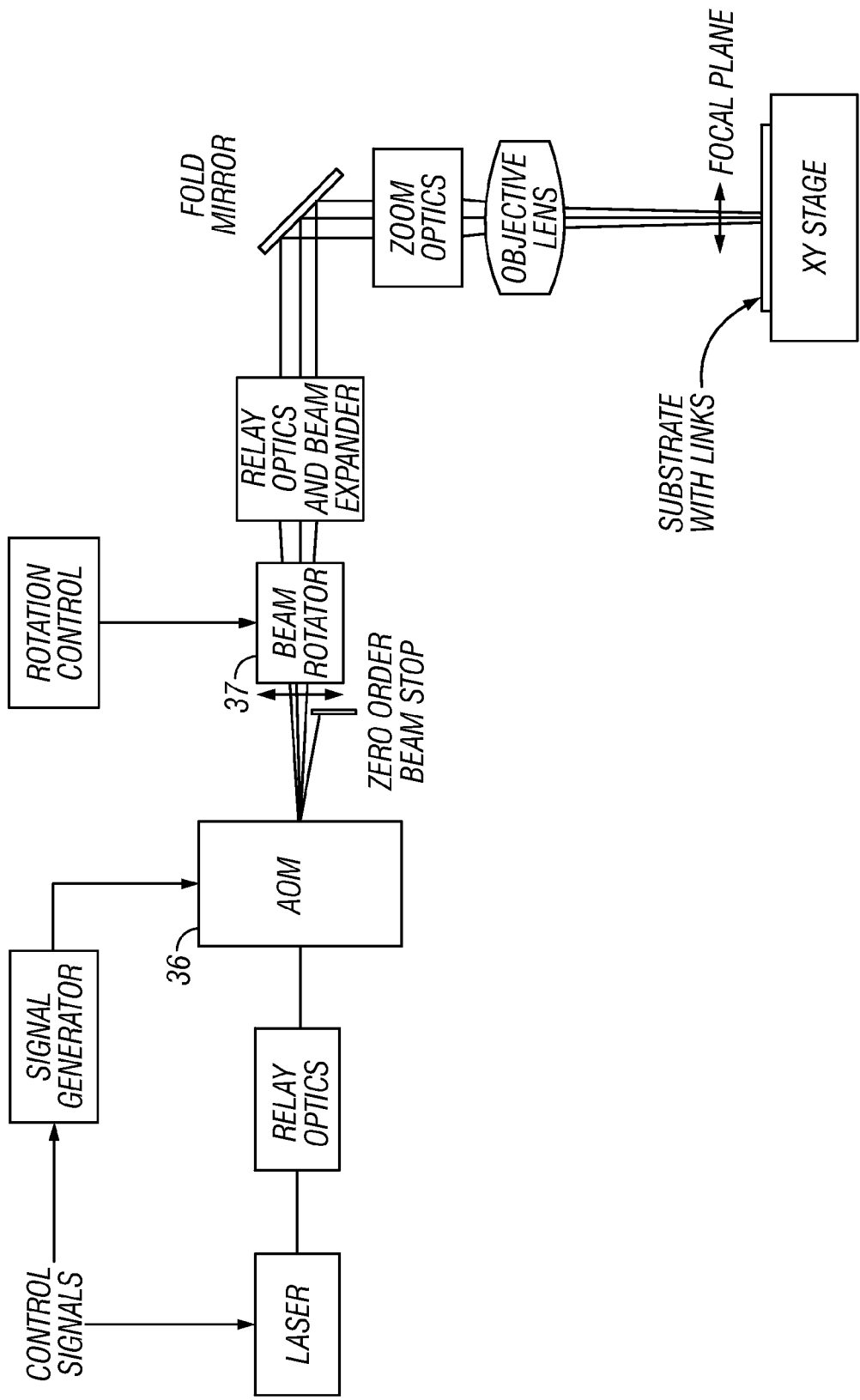
FIG. 6 is a block diagram of a laser processing system with non-orthogonal beam deflection capability.

FIG. 6 is a block diagram of one embodiment of a link blowing apparatus configured according to one embodiment of the invention. This system is similar in structure to FIG. 20 of U.S. 2002/0167581 described above. In the system of FIG. 20 of U.S. 2002/0167581, an acousto-optic modulator is used as a beam splitter. In some embodiments of the present invention, an acousto-optic modulator 36 is used to sweep the beam axis in a direction that is neither parallel to nor orthogonal to the fundamental direction of beam motion during an on-the-fly beam pass over the device being processed. As described in more detail below, the AOM may be configured to deflect pulses at an angle substantially equal to 45 degrees to a processing axis. In some embodiments, more than one deflector is present or a two-dimensional AOM may be used to sweep the beam axis at angles that are substantially perpendicular to each other and tilted with respect to the processing trajectory.

Preferably, one or more acousto-optic modulators achieve fast, accurate and stable power control with a wide dynamic range. However, other types of modulators, electro-optic modulators and other suitable modulators can be employed, where preferably deflection is fast enough to position a beam on a target by target basis. Modulation may be combined with other functions to reduce system complexity, for example, beam steering, beam switching, beam blocking, chirp mode focusing or pulse picking.

Thermally stable acousto-optic devices may be used in at least one embodiment of the invention to reduce beam pointing instability or to reduce optical aberrations. A thermally stabilized acousto-optic device may be used for pulse picking from a continuous pulse sequence or for beam positioning. The stabilized acousto-optic device is driven by one or more transducers at one or more frequencies with RF power. The first-order diffracted beam is deflected to a laser processing path as is well-known in the art. The frequency of the RF may be varied dynamically to position a deflected laser spot to a precise work piece location. The amplitude of the RF may be varied to change the diffraction efficiency of the acousto-optic device and modulate the beam energy. During pulsed processing and between processing pulses the acousto-optic cell receives RF power and a near constant thermal load. When a pulse is not needed for processing, the RF power is interrupted in coincidence with the non-processing pulse to allow a single non-processing pulse to pass into the zero order beam to a beam dump and then the near constant RF is resumed. Alternately, the RF frequency is interrupted in coincidence with the non-processing pulse to allow a single non-processing pulse to pass into a different order beam to a beam dump or into a deflected beam to a beam dump and then the near constant RF is resumed. Therefore, the duty cycle of the RF is typically high and thermal instability due to an intermittent RF load is reduced. RF power may be modulated between laser pulses to control thermal loading to the acousto-optic cell, for example to maintain a constant average thermal load.

Various configurations of acousto-optic beam deflectors (AOBD) as know in the art may be used. The AOBD may use single or multiple transducers attached to a single or multiple acoustic cells. Acoustic interaction zones may be superimposed or distributed serially along the optical path and may be in the same plane or in transverse planes. Any of the well-know geometries and configurations for acousto-optic scanning, such as those taught over the past 30 years or more, may be employed. For example, a first transducer and a second transducer can be mounted to be co-planar, parallel, orthogonal, or tilted on adjacent orthogonal or opposing surfaces. Transducers may be tilted or stepped and used as phased array configuration to enhance performance of the deflector.

Each transducer used is mounted to a surface of an acoustic cell and is driven with an RF signal as is well know in the field. The transducer is driven with an RF driver, and the RF driver is controlled with a frequency controller. Routine optimization of the AOBD includes maximizing Bragg efficiency, increasing modulation depth, increasing time-bandwidth product (to scan a large number of spots), and aligning entrance angle and exit angles. For example, the RF signal can be modulated in amplitude and or frequency to compensate for Bragg efficiency variation and pointing drift.

The AOBD may be constructed with acoustic materials generally offered in commercially available products such as fused silica, glass, TeO2 and the like from Crystal Technologies, NEOS and others. On axis device or an off-axis device for example using a TeO2 crystal may be used to achieve a high time-bandwidth product. Material choice and orientation is generally a matter of routine selection to match performance characteristics with the deflection application considering the beam size, scanning speed, scanning range, wavelength, efficiency and other characteristics as generally published in product literature and reviewed in technical articles, and text books readily available to workers of all skill levels in the field of optical scanning.

Figure 7:
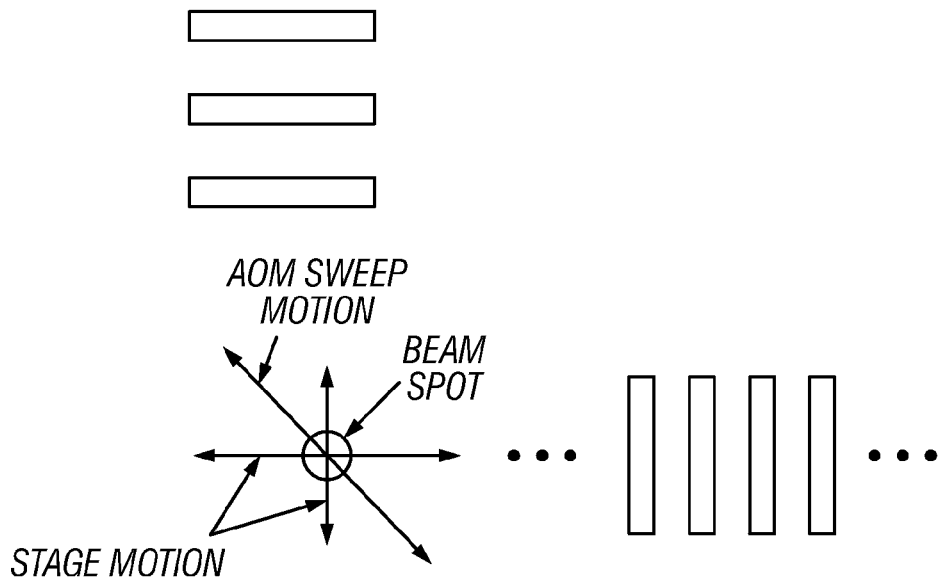
FIG. 7 is a plan view of link rows an columns illustrating axes of relative beam notion and deflection directions.

In at least one embodiment, the AOM is configured to sweep the processing beam in a direction that is non-orthogonal and non-parallel to a processing axis. In some embodiments, the deflector is oriented substantially at 45 degrees to a processing axis. As shown in FIG. 7, the AOM may be configured such that the deflection angle is oriented substantially 45 degrees to both the horizontal and a vertical processing axes.

Figure 8A:
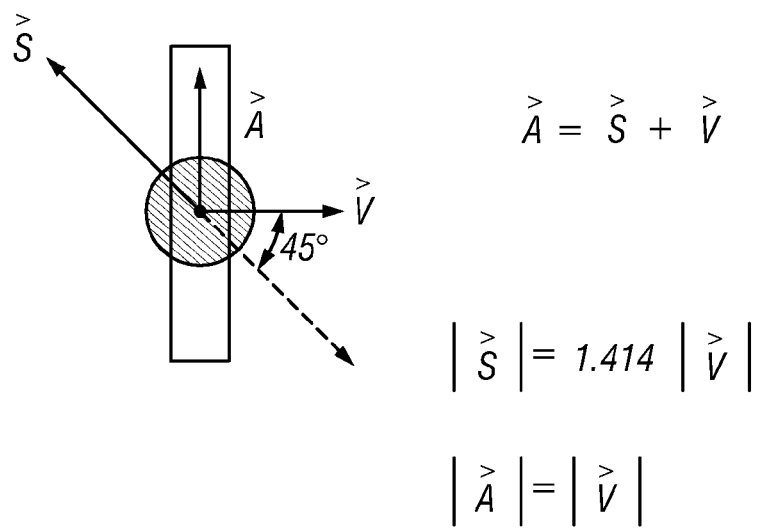
FIGS. 8A and 8B is a plan view of a laser spot on a link showing vectors of motion and deflection.

In one embodiment, a parallel component of the sweep velocity vector component produces motion in the direction of a substrate positioning axis, and may be used to maintain spot alignment across the link. As shown in FIG. 8A, the spot may be deflected at a velocity S that is 1.414 times the link velocity V produced by the underlying on-the-fly pass, so that the component spot velocity across the link L precisely matches the link velocity ($V=L=S/1.414$). However, in the orthogonal direction, a beam spot velocity A at the link processing velocity results along the link ($A=V=S/1.414$). Therefore, during link processing, the beam spot moves along the length of the link, rather than across the link.

The link blowing process may be extremely sensitive to misalignment across the link, for example about 50 to 250 nanometers misalignment may adversely affect the process window with decreased pulse energy thresholds for substrate and/or neighbor link damage. But, it is recognized that this error along the link may be considerably larger without adversely affecting the process window, for example from 0.5 to 5 microns. The link blowing process window is more tolerant to this type of error and pulse energy thresholds for substrate and/or neighbor link damage may not be adversely affected.

Furthermore, an elongated spot along the link may improve the process window, so lateral motion with a 45 degree oriented deflector may improve the process window by elongating the spot as integrated over the burst to form a temporally shaped spatial spot irradiance profile. Spot elongation may be increased with an increased link velocity, an increased irradiance period or a combination.

Figure 8B:
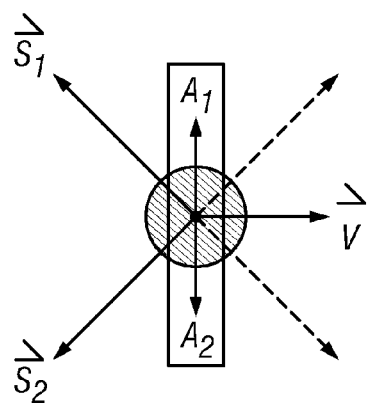

In some embodiments, the beam spot may be swept in a plurality of directions. For example, as illustrated in FIG. 8B, a two-dimensional deflector may be configured to deflect pulses in two orthogonal directions, $S_1$ and $S_2$, both of which are oriented at about 45 degrees with respect to the X and Y processing axes. In this instance, deflection of the pulse at $1.414*V$ along the first direction $S_1$ results in movement up the link along the direction $A_1$. Deflection of the pulse at $1.414*V$ along the second direction $S_2$ results in movement down the link along the direction $A_2$.

Figure 9A:
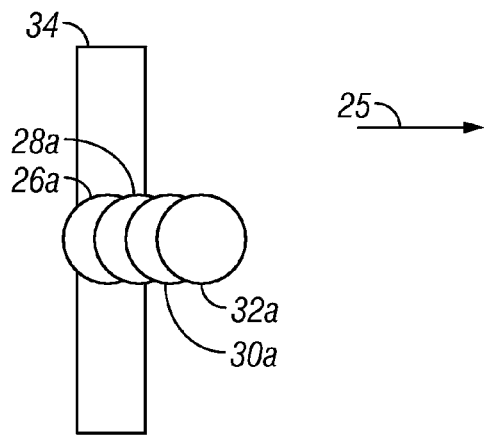
FIGS. 9A and 9B show spot motion on links.
Figure 9B:
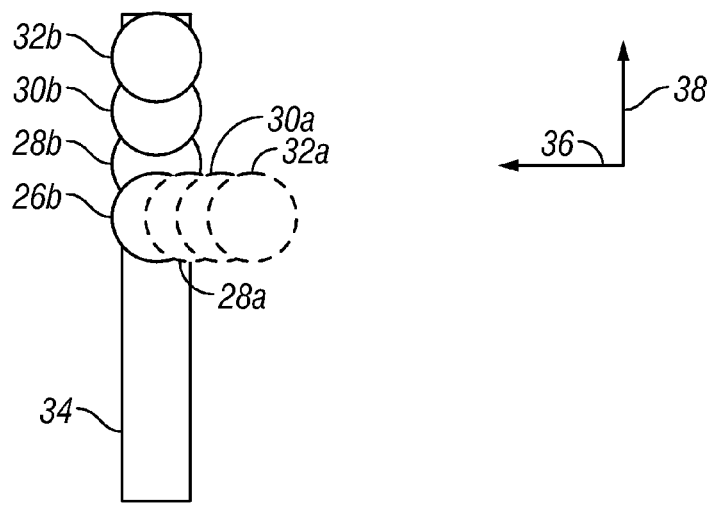

Applications of the tilted beam scan for link processing with multiple pulses per link are illustrated in FIGS. 9, 10, and 11. For example, FIG. 9A illustrates the effect of relative movement in a first direction 25 between a plurality of initial beam paths 26a, 28a, 30a and 32a and a target structure 34: the later pulses (e.g., 32a) are less coincident with the target structure than the earlier pulses (e.g., 26a). In FIG. 9B, three of the four pulses 26a, 28a, 30a and 32a are deflected to produce the resultant pulses 26b, 28b, 30b and 32b both in a second direction 36 to oppose the relative movement of the beam paths and in a third direction 38 perpendicular to the relative movement.

The non-parallel direction may comprise a component that is perpendicular to the direction of relative movement of the beam paths. The pulses may also be deflected in a direction parallel to the direction of relative movement of the beam paths. For example, a first deflector may act to oppose the relative movement of the beam paths, while a second deflector acts to deflect the pulses in a direction perpendicular to the relative movement of the beam paths.

In some embodiments, two or more pulses are deflected. The magnitude and/or the direction of the deflection may differ across pulses. For example, the relative movement between the beam paths and the target substrate may cause a first initial pulse 32a to be further from the target structure than a second initial pulse 28a. The first initial pulse 32a may therefore undergo a stronger deflection than the second initial pulse 28a.

The number and/or frequency of pulses and/or the dimensions of the target structure may at least partially determine the direction of deflection. For example, the magnitude and/or direction of the deflection may be determined in accordance with overlap between portions of the target structure irradiated by a plurality of pulses and/or in an effort to control the total area irradiated by the plurality of pulses.

In some instances, a system or method herein may produce resultant pulses from initial pulses. The initial pulses may comprise deflected or undeflected pulses. Resultant pulses may comprise one, two or more of the initial pulses that have been deflected in a direction non-parallel to the direction of relative movement of the beam paths. Resultant pulses may also comprise one, two, or more of the initial pulses that have not been deflected in a direction non-parallel to the direction of relative movement of the beam paths. The resultant pulses may include pulses deflected in a direction non-parallel to the direction of relative movement as well as pulses that are not deflected in the non-parallel direction. For example, in FIG. 9B, resultant pulse 26b corresponds to the same spatial location as initial pulse 26a, while resultant pulses 28b, 30b and 32b correspond to different spatial locations than initial pulses 28a, 30a and 32a.

In some instances, the direction or magnitude of the deflection at least partially depends on one or more of the frequency or number of pulses, the speed of the relative movement between the beam paths and the substrate, and the separation between target locations. For example, FIG. 10A shows three initial pulses 40a, 42a and 44a and their coincidence to a target structure 46. The initial pulses 42a and 44a can be deflected in a first deflection direction 48 to produce the resultant pulses 42b and 44b. In FIG. 10B, there are five initial pulses 50a, 52a, 54a, 56a and 58a. Deflecting the initial pulses in the same direction would cause the later pulses (e.g., 56a and 58a) to extend beyond the length of the target structure 46. Therefore, these initial pulses 50a, 52a, 54a, 56a and 58a are deflected in a second deflection direction 60 that is different from that of the first deflection direction 48.

The resultant pulses may coincide with portions of the target structures that are spatially distinct and partially overlapping, In some embodiments, the portions are non-overlapping. The portions may extend across a length of a target structure, wherein the length of a target structure may be a direction perpendicular to the direction of relative movement between the beam paths and the substrate.

Figure 11A:
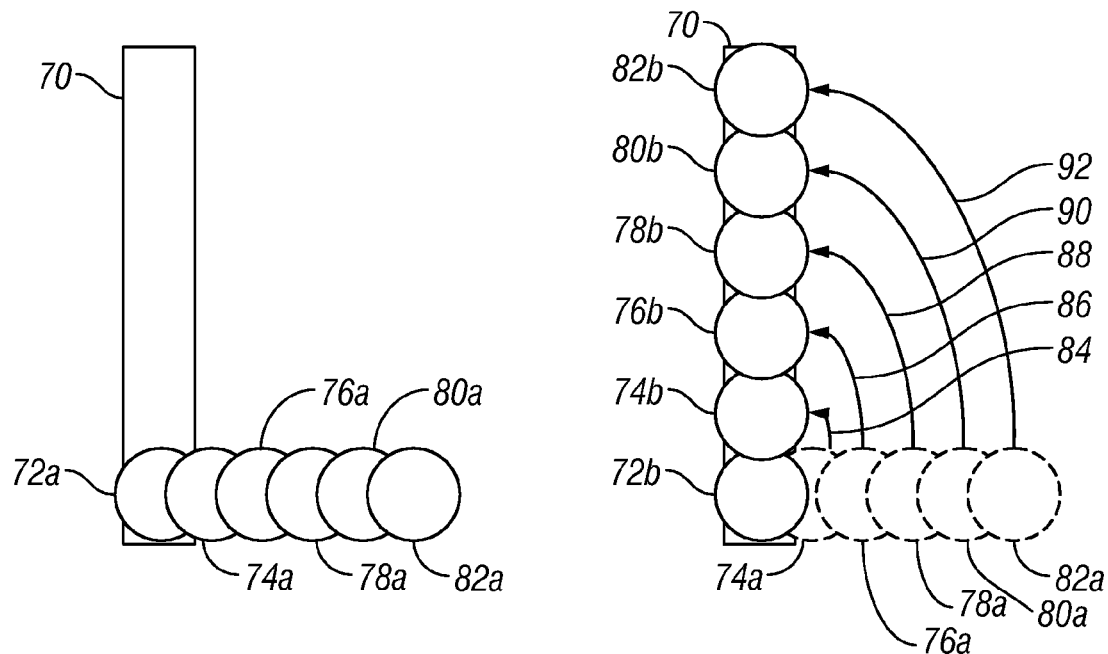
FIGS. 11A and 11B show spot motion on links in another embodiment

FIG. 11A illustrates an example in which initial pulses 72a, 74a, 76a, 78a, 80a, and 82a are moved relative to a target structure 70 in a first direction. The initial pulses 72a, 74a, 76a, 78a, 80a, and 82a are aligned in a second direction perpendicular to the first direction to be aligned with an end of the target structure 70. The initial pulses 74a, 76a, 78a, 80a, and 82a can then be deflected in deflecting directions 84, 86, 88, 90, and 92 non-parallel to the direction of motion to produce the resultant pulses 72b, 74b, 76b, 78b, 80b, and 82b. In some instances, the deflecting directions 84, 86, 88, 90, and 92 are the same across pulses, while the magnitude of the deflection differs. In other instances, the deflecting directions 84, 86, 88, 90, and 92 differ. The latter option may be advantageous, for example, if the middle of the target structure 70 is more sensitive to irradiation or is less sensitive to misalignment.

Figure 11B:
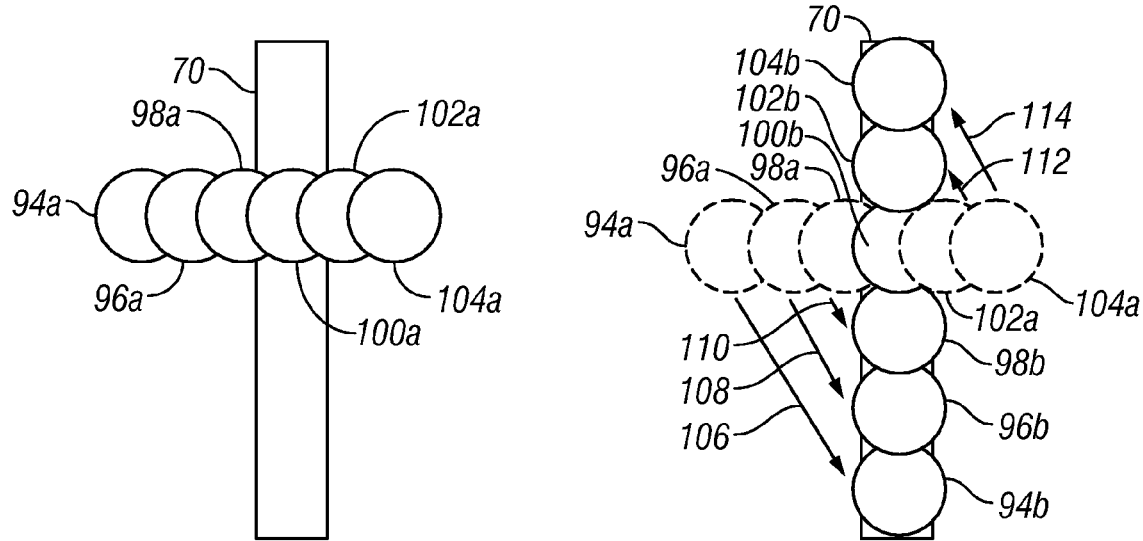

In FIG. 11B, initial pulses 94a, 96a, 98a, 100a, 102a, and 104a are similarly moved relative to a target structure 70 in a first direction. However, the initial pulses 94a, 96a, 98a, 100a, 102a, and 104a are aligned in a second direction perpendicular to the first direction to be aligned with a middle portion of the target structure 70. The initial pulses 94a, 96a, 98a, 102a, and 104a can then be deflected in deflecting directions 106, 108, 110, 112 and 114 non-parallel to the direction of motion to produce the resultant pulses 94b, 96b, 98b, 100b, 102b, and 104b. The deflecting directions 106, 108, and 110 may include components in the direction of motion in addition to components perpendicular to the direction of motion. Meanwhile, the deflecting directions 112, and 114 may include components opposite to the direction of motion in addition to components perpendicular to the direction of motion. Thus, one or more of the pulses may undergo a deflection in different direction that one or more other pulses.

In some embodiments, it may be desirable to increase or decrease spot elongation in a temporally shaped spot irradiance profile during extended irradiation periods while using a single deflector and image rotation. Referring back to FIG. 6, by using an image rotator 37 such as a dove prism to orient the deflection angle, the deflection orientation angle may be arbitrarily set relative to the positioning system. In this case the spot alignment across the link can be compensated by considering the vector component of motion across the link (sin θ*S=V=L) and the rotation angle can be adjusted to increase or decrease the lateral spot motion along the link (cos θ*S=A). For example, if the deflector scans at about 26 degrees to the link axis, the lateral motion along the length of the link will be twice the corrected link motion.

The scan rate along the link can be nonlinear as shown, for example, in FIG. 11B, or can be a discontinuous pattern within bandwidth limitations of the beam deflector. For example, multiple scans along a link within one burst may be possible. Of course many other patterns are possible for integrated spot shaping with long bursts. The energy painted on the link with this type of patterning over a dense burst of many pulses provides spot shaping with the energy integrated over the length of the burst.

The AOBD scanner may be used with closely spaced multiple input frequencies to cause multiple simultaneous output spots to merge into a single shaped spot. The shaped spot may be somewhat linear with a flattop cross section in the long axis. With two axis AOBD deflection and multi-frequency inputs, rapid spot shaping can be accomplished in either the x or y scan axis or in both axes combined.

Figure 12:
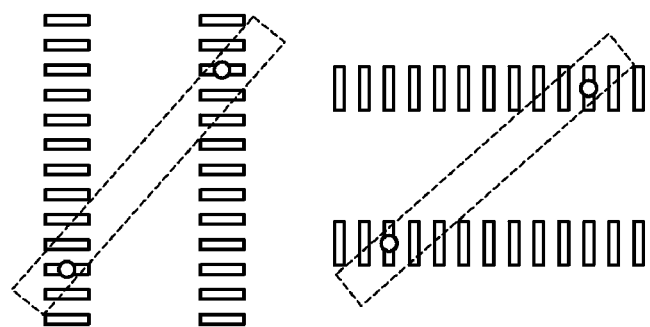
FIG. 12 shows non-orthogonal deflection used to blow links in adjacent rows or columns in a single pass.

As shown in FIG. 12, two or more rows of links oriented in either the x or y axis can be addressed with a single AOBD oriented at an intermediate angle such as 45 degrees. In this case, a link to link diagonal between rows may not be precisely 45 degrees. This alignment error can be accommodated with auxiliary beam rotation, pulse timing correction, trajectory path planning or a preferably with secondary scan axis. The secondary scan axis may have a small range sufficient to correct for spot placement errors of a larger range scan axis Using a secondary AOBD scan axis can eliminate the need for any image rotation when simultaneous processing is not employed. Since the secondary scan axis range can be small, on the order of one or two link pitches, errors generated from separation of the two AOBDs without intermediate relay optics are reduced. The main 45 degree scan axis pupil is imaged to the objective lens, the secondary AOBD is located close to the main AOBD and small pupil errors may generate acceptably small position errors over the secondary scan range, for example position errors resulting from small errors in focus height.

Use of a tilted primary scanner with a small range secondary scanner can provide improved performance compared to conventional non-tilted 2-axes scanning. For example, the smaller range of the secondary scanner can reduce undesirable scanning consequences including efficiency variation with scan angle and beam motion across the scanner input pupil especially when the secondary scanner is upstream of the primary scanner in the optical path. The scanners may be optimized differently according to scan range, or they may be similar devices. The scanning range may be set according to command signals such that the smaller scan range is a sub-range of a larger scan range. In this case the roles of primary and secondary scanner can be reversed by the system controller to switch the large and small scan ranges for example to change the orientation of the primary scan axis without using beam path switching or image rotation. The tilted primary scan axis may require a larger scan range than an orthogonal scanner, and additional trajectory overhead at the beginning and ending of each processing pass may be required.

Tilted 2-axis scanning can also be used to minimize undesirable consequences of compound-angle scanning where a first scanner deflects the beam through in a first scan plane and a second scanner deflects deflected beam through a second non-parallel scan plane. The resulting deflection is in a compound angle which can affect beam characteristics. For example, in a conventional orthogonal and square scan field, the worst case compound angle is in the corners of the field. When 45 degree tilted scanners are used to scan the same field size, the worst case compound angle scanning is at the midpoint of each edge of the scan field, a lesser compound angle, whereas at the corners of the field the scan angle have minimal compound angles.

Furthermore, the image rotator can be used to provide a flexible system that can selectively scan along either the x or y axes in addition to intermediate angles. Since the deflecting orientation is rotated at twice the rate of the beam rotator, a 45 degree rotation of the image rotator permits 90 rotation of the deflection orientation, for example from the x axis to the y axis through 45 degrees. A 67.5 degree rotation of the image rotator produces a 135 degree rotation of the deflection orientation, for example from the x axis to 45 degrees to the y axis to −45 degree. With bidirectional deflection, a 90 degree rotation of the deflector permits deflection along any azimuth.

In some embodiments, it is desirable to have at least a small amount of image rotation to align an axis of deflection with a device to be processed. When wafers are mounted onto a wafer chuck, typically there is a residual rotation of the wafer and a small rotation of the scan axis can be used to correct for resulting alignment errors. For example, the axis of an AOBD is aligned to be orthogonal to a row or column of links. In this case, spots may be laterally offset to coincide with one or more collinear links without significant errors due to relative rotation of the scan axis and the device geometry.

Figure 13:
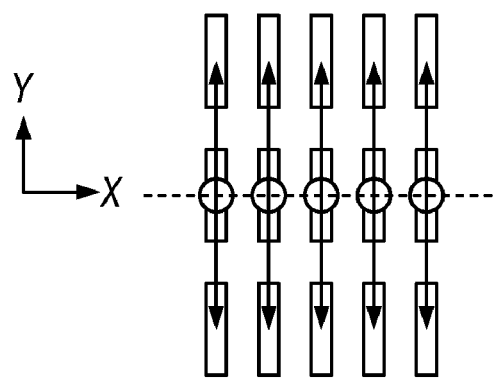
FIG. 13 shows multiple beam processing of three parallel rows or columns of target structures.

Image rotation is useful when multiple spots are used simultaneously to irradiate one or more links. In these embodiments, multiple laser beam paths are simultaneously produced and may be directed to multiple spots on the device being processed. Typically, each separate beam can be blocked so that none, one, two, or more separate locations can be simultaneously processed. The multiple spots may be on a single target structure, or may be distributed among several target structures. The scan axis can be aligned to accommodate to the geometry so that two or more links can be processed with a single pulse or a single group of pulses. This is illustrated in FIG. 13, where a beam path in the X-direction over three parallel rows of links is split to selectively process any one or more of the three links along the orthogonal Y direction. Control of the precise orientation of the scan axis perpendicular to the rows is useful to minimize errors along the width of the link for links at the ends of the scan path.

Figure 14:
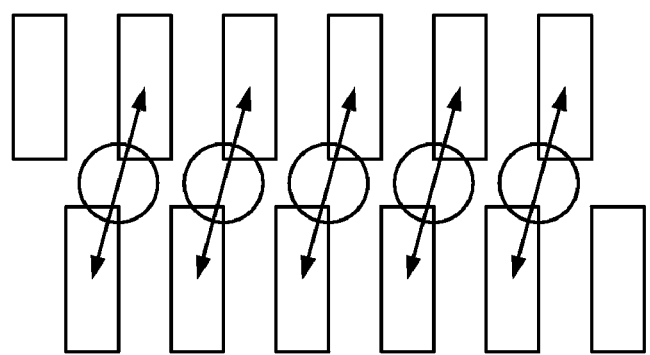
FIG. 14 shows multiple beam processing of two staggered parallel rows or columns of target structures.

A tilted scan angle with controlled orientation can be useful for multiple beam processing of adjacent staggered link rows as shown in FIG. 14. In this case, the scan axis along which a pair of beam paths diverge is neither parallel nor perpendicular to the rows of links. Image rotation in this embodiment can align the scan axis with any variation in link pitch and row separation.

Figure 15:
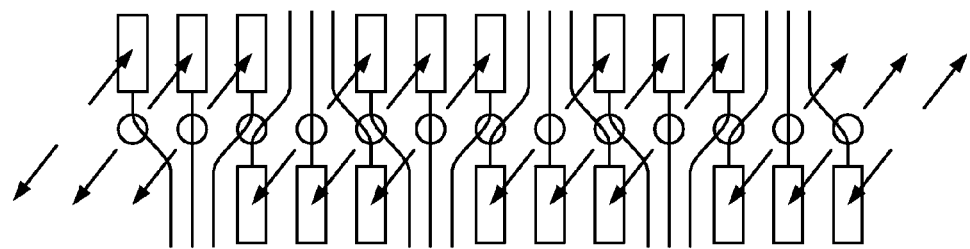
FIG. 15 shows multiple beam processing of two fanned out parallel rows or columns of target structures.
Figure 16:
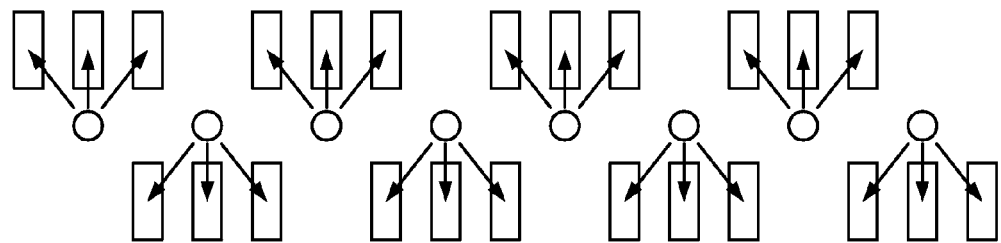
FIG. 16 shows another embodiment of multiple beam processing of two fanned out parallel rows or columns of target structures.
Figure 17:
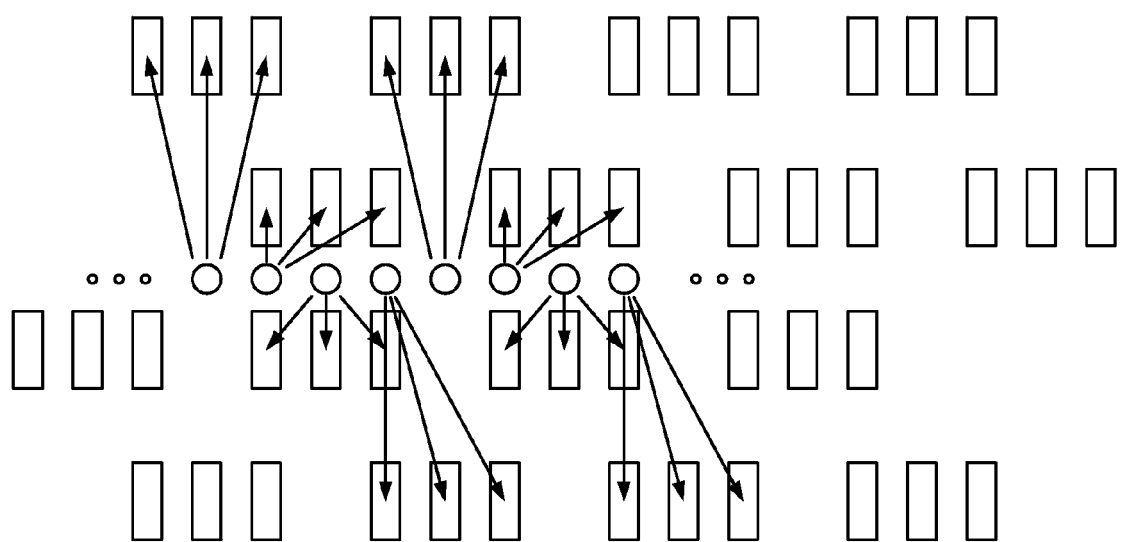
FIG. 17 shows multiple beam processing of four fanned out parallel rows or columns of target structures.

In some fuse bank geometries, the average link pitch is reduced by using fanned out groups of staggered links. For example, groups of three fanned out links alternate in two staggered rows. One such arrangement is shown in FIG. 15. These types of link arrays are also illustrated, for example, in U.S. Pat. No. 5,636,172 to Prall et al. FIG. 15 shows an embodiment with two beams separated along a scan path to process none, one, or both links of staggered pairs of links in the array. Image rotation may align a scan axis with different combinations of links in fanned out geometries. For example, FIG. 16 illustrates a three beam path embodiment for processing two rows of fanned out links in a single pass. FIG. 17 illustrates a three beam path embodiment for processing four rows of fanned out links in a single pass.

Figure 24:
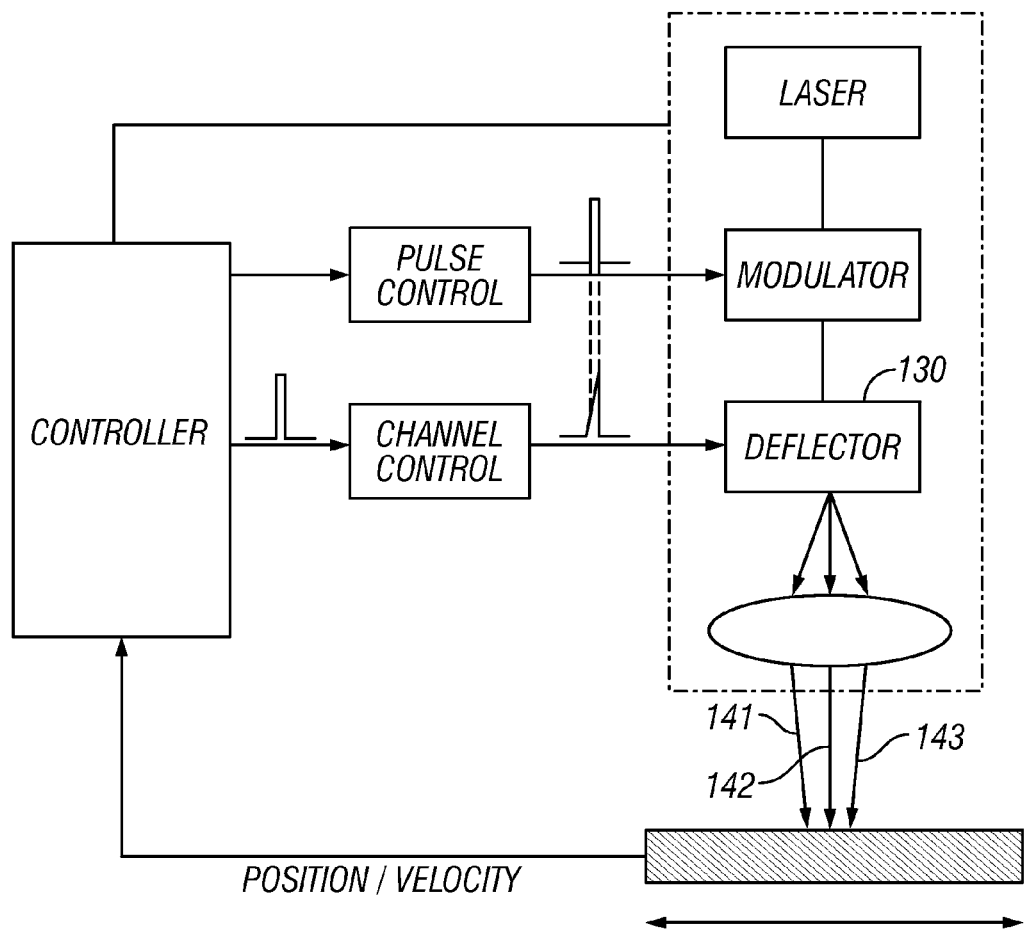
FIG. 24 is a block diagram of a laser processing system implementing multiple link blowing channels.

In one example for processing N rows of links, a first pulse is split along a first row to irradiate one or more links in a selected group of links in the first row. A second pulse is likewise split and deflected to a second group of links in a second row (as in FIG. 22). Referring to FIG. 24, third and fourth pulses are split and deflected to third and fourth rows. A fifth pulse is split and deflected back to the first row to continue a repeating sequence. The pulses can be split into M spots where M=N to irradiate all structure in N rows of an array, M<N when there are gaps between groups, or >N to redundantly address links.

Thus, when pulse splitting is employed with an AOBD to simultaneously process 2 or more links, the spots are located along the scan axis of the AOBD, and image rotation may be useful to align the spots to multiple links especially when multiple links are not located along a single row and hence rotation error of the scan axis generates spot position errors relative to the width of the link. Image rotation may not be required when multiple links being processed are in a single row and rotation generates small tolerable errors along the length of the link.

It will be appreciated that in multi-beam processing embodiments, single beams can be split or multiple beam paths may be combined and critically aligned to process links. In both of these cases, delivered pulse energy is preferably controlled to provide consistent processing. Beam splitting and beam combining generally require power split calibrations. Splitting can reduce available energy by a factor or 2 or more and splitting or switching may affect beam polarization control. Reference 10 discloses various advantageous methods and optical systems using beam switching for application to memory repair, for example in addition to or in place of beam rotation.

Embodiments of this invention may use a 2 cascaded single axis deflectors or a 2 axis deflector to deflect the beam in more than one axis. In this 2 axis deflector case, linear scanning at 45 degrees or at an arbitrary orientation can be performed as described for the image rotation case.

Pupil errors of cascaded deflector can be reduced with 45 degree scanning and a small secondary axis (as shown in FIG. 13 and described below). In other cases, relay optics may be used to image each deflector window. A first deflector window may be imaged to a second deflector, or anamorphic cylinder optics may be used. For example an image relay may include two sets of crossed cylinder lenses with pairs of aligned cylinders relaying each deflector window independently. The relay may also include spherical optical elements, for example to allow a weak set of crossed cylinders elements to be used along with a spherical element.

The system of FIG. 20 of U.S. Patent Publication 2002/0167581 described above may be used in one or more embodiments of this invention. In at least one other embodiment, the deflector system is used to generate at least 2 slightly diverging beams and may generate more than two slightly diverging beams. The beams may be generated simultaneously or generated in a sequence. The deflected angle of each beam corresponds to a driven frequency in a range that is a small percentage of the center RF signal frequency. The position of each spot is proportional to the driven frequency.

Other deflector configurations may be used. For example, cascaded acousto-optic modulators or a single crystal two axis modulator can be used to position each beam without using a beam rotator. Furthermore, any type of beam positioning system with sufficient bandwidth to accurately locate a sequence of pulses may be employed.

Zoom optics may form an image of the acousto-optic window at the entrance pupil of the objective lens to minimize or eliminate beam input offset errors at the objective lens. Optionally, fixed relay optics may be used between the acoustic window and the zoom optics to form an intermediate image of the acoustic window near the input of the zoom optics. For two axis AOBD scanning a pair of AOBDs may be stacked in a crossed configuration and the mid point between the acoustic windows of each device may be imaged to the objective. Positioning errors due to residual angle errors can be determined using ray tracing or system measurement. Alternatively a pair of AOBDs may be spaced apart and the window of the first AOBD can be imaged onto the window of the second AOBD with the second window imaged or relayed onto the input of the zoom telescope using cylindrical and/or spherical elements as mentioned.

When two single-axis spaced-apart AOBDs are used, the position of the relay beam expander may be adjusted to image one of two AOBD windows onto the objective lens. For example, if two AOBDs are used for x and y beam positioning, the beam expander is adjusted axially to image either the x or the y AOBD window onto the objective. The relay beam expander may be adjusted during processing of a processing site to change the orientation of AOBD scanning. Alignment scans may be performed after the adjustment to accommodate residual positioning errors. In this way the system can be precisely adjusted for x or y beam deflecting without a relay optical system between the x and t beam deflectors The zoom optics may be a variable Keplerian telescope with three groups of elements. The first and second groups may be single optical elements and the third group may be a doublet. Each group may be moved independently according to predetermined positional data to provide a selected beam expansion and collimation. Element groups of the zoom optic may be pre aligned to minimize or eliminate beam steering effects as the expansion ration is varied. Alignment of element groups may also ensure that beam centering is maintained at the entrance pupil of the objective lens.

Residual alignment variations through the zoom range of the zoom optics may be corrected with auxiliary beam steering devices such as remotely controllable precision adjustable turning mirrors or scanning mirrors. Correction values may be stored for predetermined zoom settings and corrections may be made automatically for different zoom setting to maintain overall system calibration and alignment accuracy.

One or more spatial filters may be used at beam waist planes of the optical path for picking off unused diffraction orders and to block scattered energy and noise.

Figure 18:
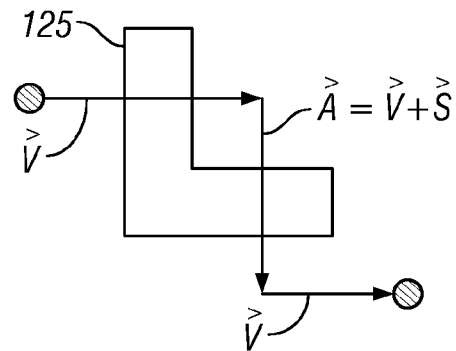
FIG. 18 illustrates spot motion over an alignment target in one embodiment.

By using a tilted deflection oriented at or rotated to 45 degrees, other advantages are possible in a laser processing system. The tilted deflection can be used in a system calibration mode to perform edge scans for alignment as is known in the field of precision laser processing equipment. In the same way that scanning for processing in 2 orthogonal axes can be performed with a tilted deflection, so to can alignment in 2 orthogonal axes be performed with a single deflector oriented at 45 degrees. When used with typical, orthogonal alignment targets 125 such as illustrated in FIG. 18, the 45 degrees scan is able to traverse either an x or a y edge, where the scan line is at 45 degrees to the alignment edge. Furthermore, if an alignment scan is performed near an inside or outside corner of an alignment target, then orthogonal edges can be scanned in a single sweep. The latter is illustrated in FIG. 18, where the beam spot moves along a scan axis at velocity V, and after scanning one leg of the alignment target, the tilted scan produced motion at speed V in the direction A to scan across the orthogonal leg of the alignment target.

Two axis scanning can also be used for alignment scans. The laser spot can be dithered in a direction parallel to the alignment target edge to sample multiple locations along the edge and average out the effects of edge defects.

Alignment aspects of the invention for example as described in sections [130], [169] and FIG. 10 of U.S. Publication 2002/0167581 may also be applied to laser systems with high pulse rates such as mode locked lasers. While q-switched laser operate in the range of about one kilohertz to a few hundred kilohertz, mode locked laser typically operate at many tens of megahertz. Various scanning and target sampling strategies can be employed. Edges can be scanned at higher rates with dense sampling depend on the bandwidth limit of the detector response. Using fast pulse picking, a pulse sequence can be multiplexed to multiple targets for alignment.

Non-Synchronous Processing

Figure 2:
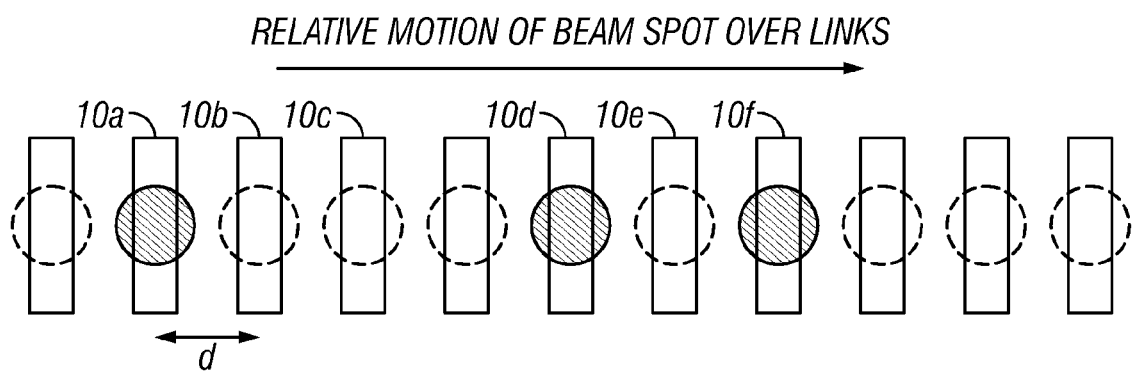
FIG. 2 is a plan view of a row of links illustrating the application of laser pulses to selected links.
Figure 3:
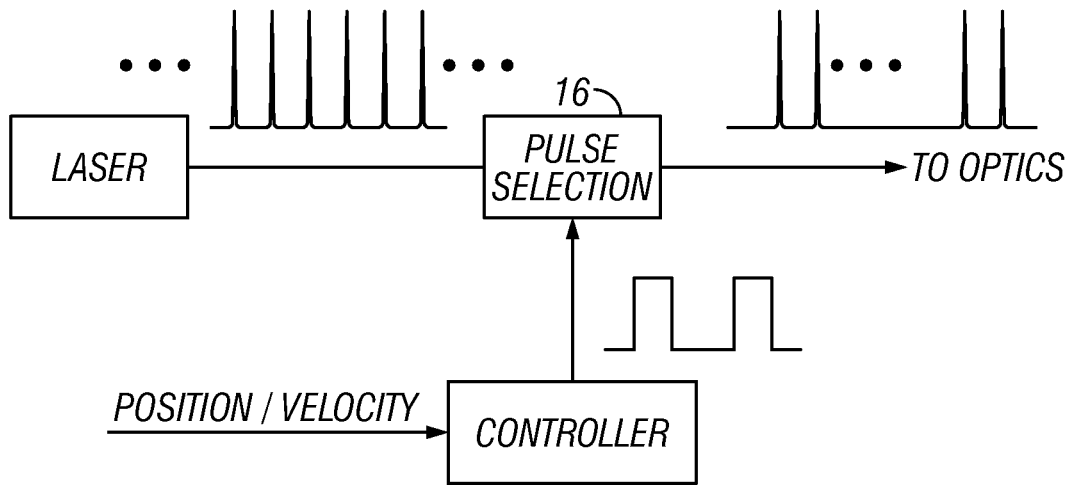
FIG. 3 is a block diagram of a multiple pulse laser processing system.
Figure 4:
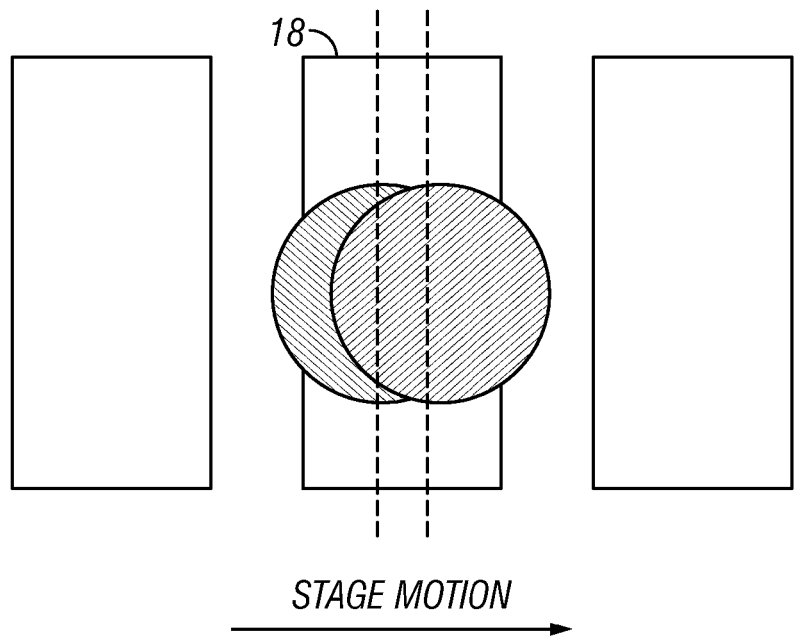
FIG. 4 is a plan view of offset laser spots applied to a link.
Figure 19:
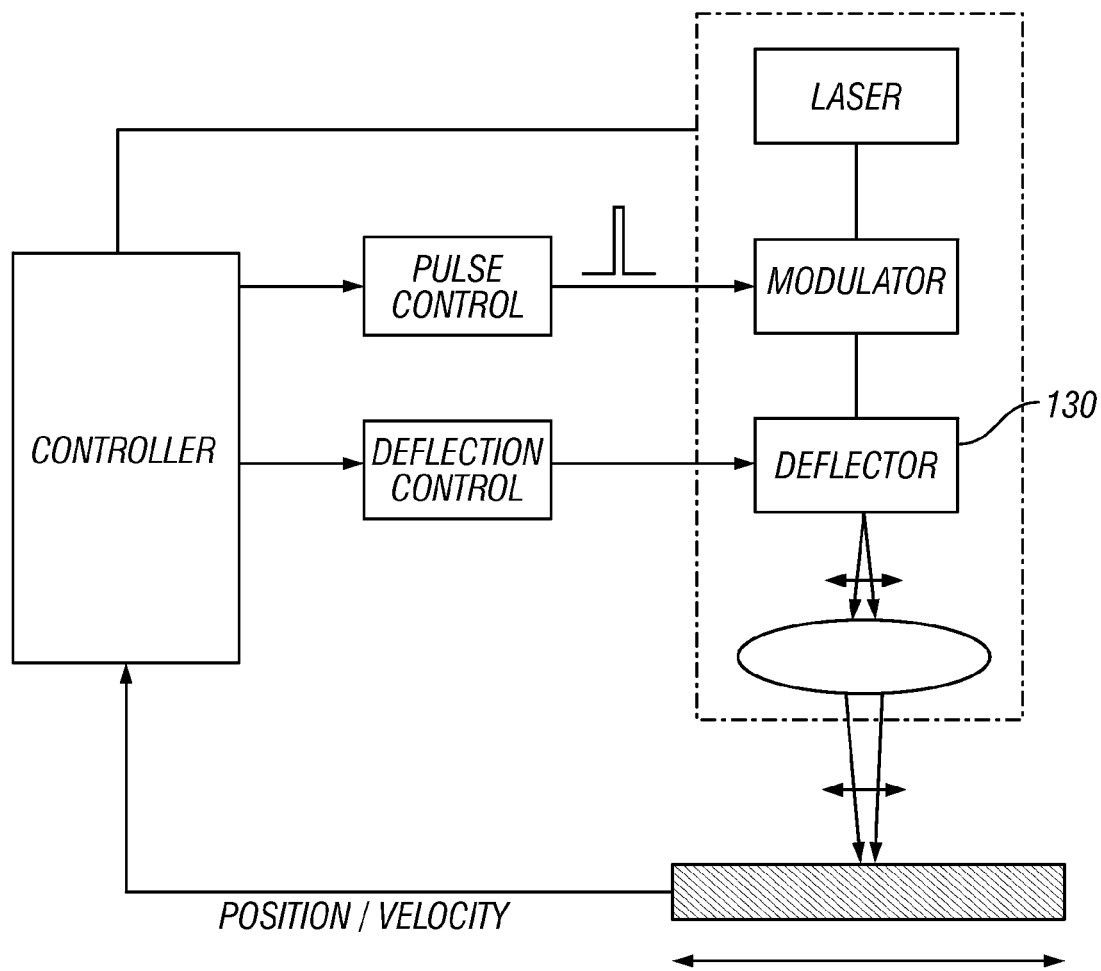
FIG. 19 is a block diagram of a laser processing system configured to deflect non-synchronous pulses to targets for processing.

In one embodiment of the invention, processing speed is increased by eliminating the requirement that the time between pulses be equal to the link to link transit time T1 described above with reference to FIG. 2. This embodiment is described with reference to FIGS. 19, 20, and 21. A pass of the beam across the same eleven links of FIG. 2 is illustrated in FIG. 20. However, in FIG. 20, only nine laser pulses (or pulse bursts) are used instead of eleven. In the embodiment of FIG. 2, the laser pulses may be produced at the same rate as in FIG. 2, (e.g. 50 kHz pulse rate), but the relative velocity between the beam axis and the links is increased so the nine pulses are still spread approximately evenly over all eleven links. To successfully process links 10*a*, 10*d*, and 10*f*, a high speed deflector is used to deflect the processing beam and offset the laser spot in the direction of the arrows on FIG. 20 to so that the spot and a link substantially coincide when a given link is to be processed. The result is illustrated in FIG. 21. Blocked pulses or pulse bursts, as shown by dotted lines on FIGS. 20 and 21, need not coincide with any potential target structure. A precise offset for processing pulses can be predetermined based on the link position and the timing of the pulse sequence. If the same 50 kHz laser pulse rate is available in the process of FIGS. 20 and 21 as the conventional example of FIG. 2, the pass can be completed in 160 microseconds, for about a 20% processing speed improvement. An apparatus suitable for performing this technique is illustrated in FIG. 19. During processing, a deflected spot offset is determined by the controller for each link to be processed relative to a selected pulse. The high speed deflector applies the offset for processing.

It is apparent that when T1 is less than the laser pulse to pulse period, there will be insufficient available pulses in the sequence to have a pulse available for every link. However, in an exemplary memory repair application, a relative few links, for example 1 in 10 links are processed and a majority of links remain intact. Therefore, without the constraint of 1 to 1 link to pulse synchronization, generally a sufficient number pulses are available to process a device at an increased velocity. If, for example, the time between laser pulses is 1.25 times T1, a series of up to about eight adjacent links could be processed if the deflector was capable of deflecting the pulse forward or backward up to the distance d between each link. In practice, it is relatively rare that even four or five consecutive adjacent links are processed. Thus, using high speed deflection and determined spot offsets, relative velocity between links and a laser processing head can be increased and can exceed conventional limits. In other cases, rather than increasing processing speed, other benefits can be obtained by using lower pulse repetition rates while maintaining conventional processing speeds. For example, it may be desirable to operate a laser at a reduced repetition rate for increased pulse to pulse stability, to use alternate pulse widths, or to accommodate different positioning velocities without altering the repetition rate such as processing near the edge of a stage travel range.

As described above, recent developments have included multiple beam systems that can process two or more link sites simultaneously. Although this increases throughput, it is likely that in most applications, a similar or better throughput increase can be obtained with the non-synchronous processing described herein. Thus, spot offsets can be used in a sequential process and can reduce requirements for simultaneous processing which can require more complicated beam control. Combining the two techniques, e.g. using multiple non-synchronous pulsed beams could provide still further throughput enhancements.

Mixed Pitch Processing

The deflector 130 of FIG. 19 can also be used to process rows of links with gaps or sections of different pitch. FIG. 22A shows a series of links with different link separations. In some cases such as in FIG. 22A, the spacing between links is different in different areas, but the pitch phase is constant, which will occur if the distance between any two links is an integer multiple of the smallest pitch. In FIG. 22A, for example, $s_1$ is 3 d long and $s_2$ is 2 d long. The same nine pulses of FIG. 20 can still be used to process this structure.

Mixed Phase Processing

FIG. 22B shows another link arrangement where two sets of links in a common row both have the same pitch, but are out of phase with each other. This will occur when the distance s is not an integer multiple of pitch distance d. Conventionally, such link arrangements were time consuming to process. If the entire row including both sets of links was processed in a single pass, twice as many pulses were produced so that the pulses were synchronized with both pitches for the entire pass. Alternatively, two separate passes at full speed could be used, which takes time to set up between passes.

With the deflector 130, the pulses associated with one of the link sets can be offset during the pass to match the phase of that group, as shown by the arrows of FIG. 22B. The deflector 130 can thus perform on-the-fly phase correction and process such link arrangement much faster than conventional systems. Phase correction can be used to stabilize laser pulse energy by minimizing changes to pulse to pulse periods and reducing or eliminating associated settling times.

Link Severing During Acceleration

Figure 23:
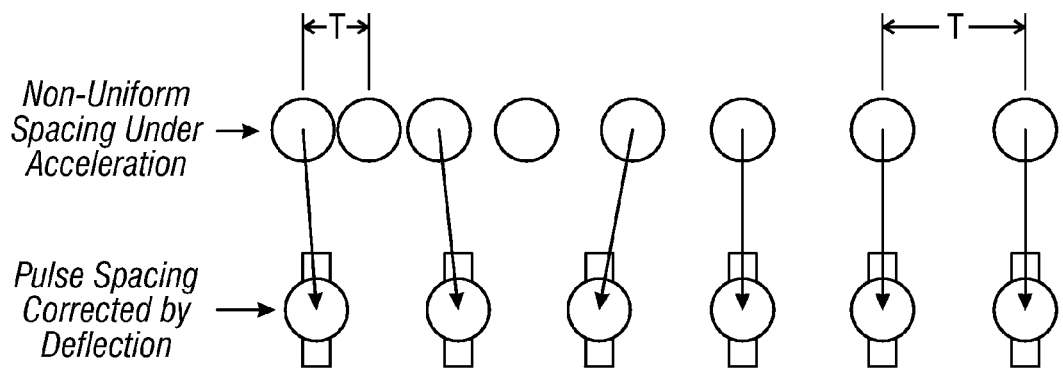
FIG. 23 shows link severing during a non-constant velocity segment of a trajectory.

These techniques can also be used to sever links during non-constant velocity segments of a beam trajectory. As shown in FIG. 23, during an acceleration segment of a trajectory, a pulse period T will produce a different beam spot spacing between pulses at different points in the trajectory. Beam deflection can be used to correct beam spot position to match the link positions for links to be processed. The ability to process links during acceleration, deceleration, and other non-constant velocity portions of a beam trajectory can reduce processing time.

Multi-Channel Processing for Link Buffering

Figure 25:
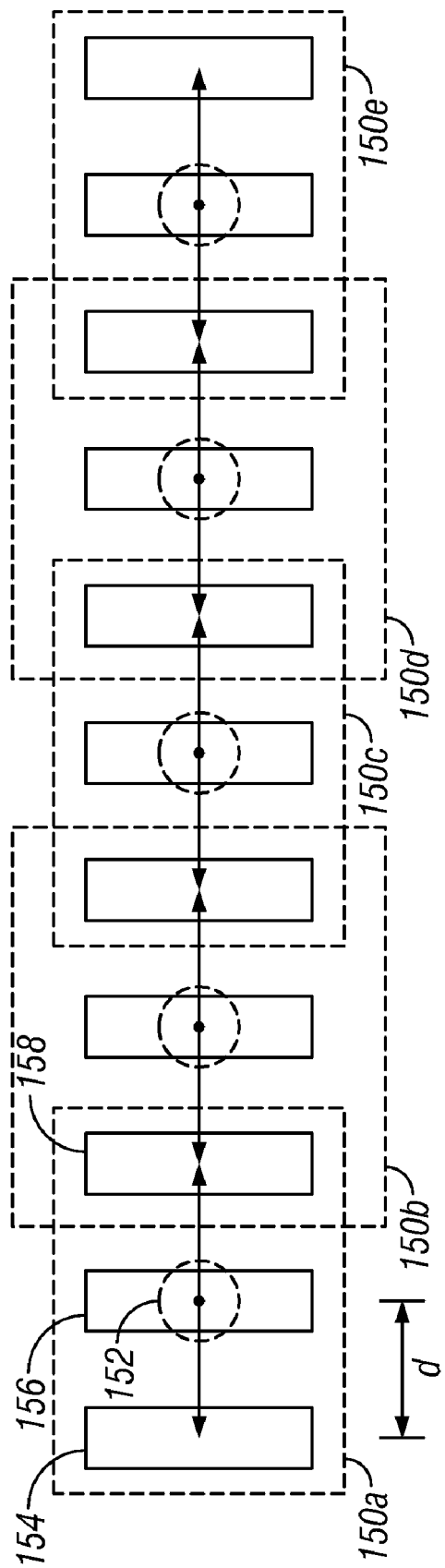
FIG. 25 is a plan view of a link row illustrating link groups.

FIGS. 24 and 25 illustrate another system and method for processing links at a faster rate than conventional processing. In this embodiment, the deflector 130 selects a channel 141, 142, or 143 that causes the pulse to hit the substrate being processed at three different locations. The distance between beam spots for adjacent channels can be set equal to the link pitch d. The links are assigned to link groups 150*a*-*e*, each containing N links, where in this embodiment N is equal to 3. Depending on the channel selected for beam spot 152, link 154, 156, or 158 can be processed with that pulse. If the groups overlap, some links can be processed with either of two pulses. This embodiment provides a potential doubling of processing speed, as only one pulse is produced for every two links. Thus, in a pass over M links, only P pulses are produced, where P is half of M. However, although any pair of adjacent links can be processed, there are not enough pulses available to process a series of three or more adjacent links. As described above, though, in some cases this may not be present in a link group being processed in a pass. However, groups with very large numbers of links may have occurrences of adjacent links even when a small percentage of links are processed.

Figure 26A:
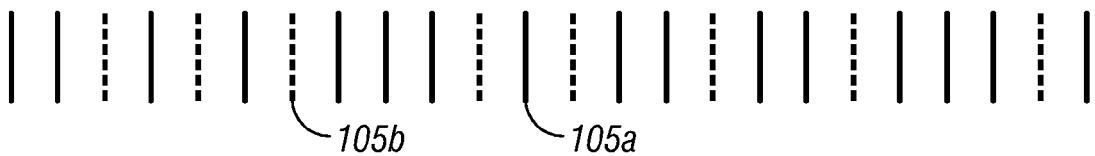
FIGS. 26A-26E illustrate additional link grouping options in a link row.

It will be appreciated that information regarding the number and location of links to be processed in a pass can be used to determine the optimum size and positioning of the link groups. FIG. 26A shows a plurality of structures indicated by thick lines. The black lines correspond to non-target structures 105*a*, and the grey lines correspond to target structures 105*b*.

Figure 26B:
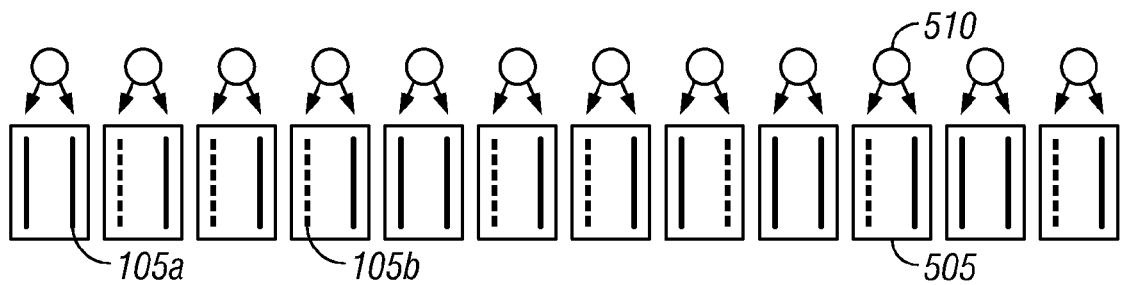

As illustrated in FIG. 26B, structures may be grouped into sets 305 of two structures 105. Within each set 305, the number of structures 105 that are target structures 105*b* may be determined. For example, sets 305*d* and 305*h* each include one target structure 105, while set 305*a* does not include any target structures 105*b*. In total for this example, 4 of the 12 sets contain no target structures 105*b*, 8 of the 12 sets contain only one target structure 105*b*, and none of the 12 sets contain more than one target structure 105*b*.

Figure 26C:
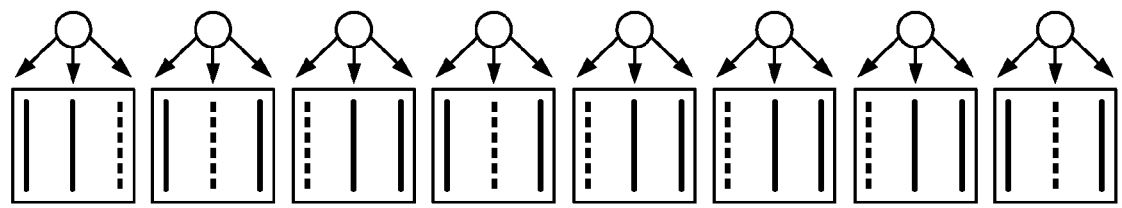

In some embodiments, groups of different sizes are examined prior to performing a pass. For example, in FIG. 26C, the same structures are grouped into sets of three structures. As before, the number of target structures in each group can be determined. In this instance, none of the 8 sets contain 0 target structures, 8 of the 8 sets contain only 1 target structure, and none of the sets contain 2 or 3 target structures. Therefore, grouping structures into sets of three provides fewer sets containing no target structures (0 of 8 sets) than would grouping structures into sets of two (5 of 12 sets). If one pulse is produced for each set, the efficiency and/or the speed of processing may be further increased when using sets of three rather than sets of two.

Figure 26D:
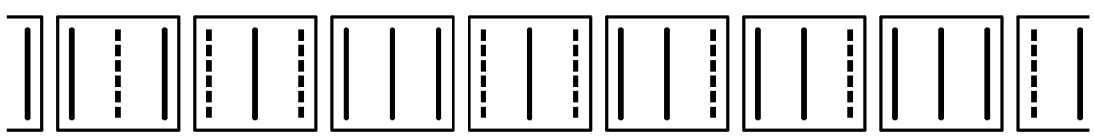

Notably, the effect of grouping may depend upon the phase of the groups. For example, FIG. 26D shows another grouping into sets of 3 structures, wherein each grouping is shifted compared to that in FIG. 26C. Therefore, while the grouping of FIG. 26C included no sets with no target structures, the grouping of FIG. 26D includes two sets with no target structures. Additionally, while the grouping of FIG. 26C did not include any sets with two target structures, that of FIG. 26D includes two sets with two target structures. This arrangement could not be processed with a single pulse for each set. In some embodiments, for each set size, the groupings may be shifted in order to determine whether a particular grouping offset provides preferred target structure distributions.

Figure 26E:
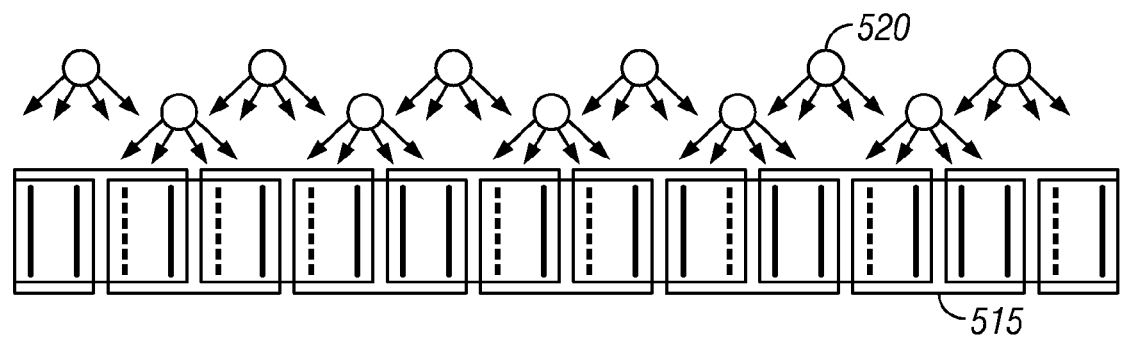

FIG. 26E shows structures 105 grouped into sets 515 of four structures, wherein each set 515 overlaps with the previous set 515 by two structures. As before, one or more pulses 520 may be generated for each set. However, in this embodiment, any given structure may be irradiated by more than one pulse 520 depending on the deflection. In this example, each pulse may be deflected to irradiate one of four structures. The size of the sets 515 and the overlap can determine the number of pulses 520 which may irradiate any given structure 105.

Although the previous examples are described for a single axis deflection, the buffering/channeling technique can be used in multiple axes, for example one or more channels may correspond to different link types in a set of links in a fanned-out staggered array of links. In some cases the links are unevenly spaced and are located in multiple rows. Various embodiments of this invention may be practiced at the same time, for example one or more of, spot shaping, and link buffering. In some embodiment, each pass is analyzed beforehand to determine whether non-synchronous, mixed pitch, mixed phase, or channeled processing would produce the optimum processing speed enhancement for the given pass. Groups of links may be analyzed to predetermine the best operational mode and slow or speed the scan rate as required in conjunction with the system trajectory planner, while maintaining a constant laser pulse rate, severing a single link per pulse. Adjacent channels may correspond to adjacent links, however greater spatial channel separations may be used to hit the same group on pitch and multiple channels may be used to access a group at multiple locations.

To deflect the beam into different channels, preferably the RF applied to the deflector when it is an AOM is generated using a multi-channel Direct Digital Synthesizer (DDS) such as Model AODS 20160 from Crystal Technologies. Alternately a group of fixed frequency drivers or a single or multiple variable frequency drivers may be used. Buffering capability of several preset frequency channel values and rapid switching between channels provides enhanced capability for laser processing of memory devices. For example, frequencies may be switched among channels of a multi-channel DDS. Frequencies may be set corresponding to spatial properties of a work piece for example, link pitch or row spacing in an array of memory repair links. Frequencies may correspond to adjacent links, a sequence of links, adjacent row, non-adjacent links, and non-adjacent rows. Frequencies may correspond to a lateral offset along or across one or more links or to a measured or predicted position error. Frequencies may correspond to temporal properties of a memory repair process, for example, a frequency may correspond to a delay associated with an inter-pulse period, a pulse burst parameter, a position timing error correction value or a measured or predicted position phase lag. Generally, channel switching occurs at rates on the order of the link velocity divided by the link pitch or a higher rates especially with multi-pulse processing. Switching time may be less than 20 ns in a DDS driver. It is to be understood that actual switching time of beam steering angles is limited by well-know acoustic propagation parameters of the AO cell.

In all embodiments described herein, corrective optics may be used to compensate for the well-known cylindrical lensing effect as well as other aberration artifacts of the AOBD. When the AOBD is operated in chirp mode, the cylindrical lensing effect increases with the scan rate, and correction may include using fixed or variable optical elements to cancel astigmatism and tilt artifacts of off-axis devices generated at the AOBD. Correction of AOBD aberrations is generally taught in published U.S. Patent Application 2006/0256181, which is hereby incorporated by reference in its entirety.

Other aberrations of AOBD devices can include chromatic aberration introduced by dispersion of the AOBD. Especially with broad band width fiber laser sources which may have bandwidths of 16 nm or more, pre-dispersion correct techniques can be employed to minimize lateral chromatic aberration in the image plane. For example, dispersion prisms and or diffraction grating can be used to compensate for the center frequency dispersion of the AO cell. Axial chromatic aberration may also be significant and focusing optics may be corrected over the full laser bandwidth to maintain small spot size and consistent spot shape.

Auxiliary detectors responsive to beam position and or energy may be used to sense position and or energy and to generate signals used for feedback in conjunction with AOBD scanning.

While the best modes for carrying out the invention have been described in detail, those familiar with the art to which this invention relates will recognize various alternative designs and embodiments for practicing the invention as defined by the following claims. All described methods and systems herein may used in any combination. Multiple pulses or single pulses may be applied to single target structures, multiple pulses or single pulses may be simultaneously applied to multiple target structures. In a processing pass, the laser pulse rate may correspond to the rate of a single row single pass processing or may be asynchronous with spatial offsets and/or buffering.

What is claimed is:

1. A method for laser processing a multi-material device including a substrate and at least one target structure, the method comprising:
receiving data corresponding to coordinates of target microstructures to be processed;
determining a processing trajectory segment including a plurality of target microstructures in an array of microstructures;
generating a pulsed laser output comprising a sequence of pulses, pulse groups, combined pulses, or pulse bursts, wherein the sequence is at least partially unsynchronized with respect to the trajectory;
determining a relative displacement between each target microstructure and at least one laser pulse in the sequence;
generating a deflection command sequence corresponding to the relative displacements;
deflecting the pulsed laser output according to the deflection command sequence during relative motion between the substrate and a beam positioning subsystem to synchronize the target microstructures with a set of laser pulses; and
irradiating each target microstructure with at least a portion of the pulsed laser output.

2. The method of claim 1, comprising producing relative motion in a first direction between the beam positioning subsystem and the substrate having at least one target structure thereon.

3. The method of claim 2, comprising deflecting a portion of the laser output in a second direction.

4. The method of claim 3, wherein the second direction is non-parallel to the first direction.

5. The method of claim 4, wherein the non-parallel direction comprises a perpendicular direction.

6. The method of claim 1, wherein the device comprises a semiconductor memory comprising a silicon substrate, wherein the at least one target structure comprises a metal link of the semiconductor memory, and wherein the metal link is separated from the silicon substrate by at least one insulator layer.

7. The method of claim 1, wherein at least one of the target microstructures comprises a conductive link.

8. The method of claim 1, wherein deflecting the pulsed laser output comprises deflecting the laser output with a high-speed deflector.

9. The method of claim 8, wherein the high-speed deflector comprises an acousto-optic deflector.

10. The method of claim 8, wherein the high-speed deflector comprises two deflectors oriented substantially orthogonally.

11. The method of claim 8, wherein the high-speed deflector comprises a two-axis deflector.

* * * * *